(12) United States Patent
Leng

(10) Patent No.: US 12,557,569 B2
(45) Date of Patent: Feb. 17, 2026

(54) FORMING A PARTIALLY SILICIDED ELEMENT

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

(*) Notice: Subject to any disclaimer, the term of this patent is extended or adjusted under 35 U.S.C. 154(b) by 559 days.

(21) Appl. No.: 18/070,748

(22) Filed: Nov. 29, 2022

(65) Prior Publication Data

US 2024/0087886 A1 Mar. 14, 2024

Related U.S. Application Data

(60) Provisional application No. 63/406,356, filed on Sep. 14, 2022.

(51) Int. Cl.
*H01L 21/02* (2006.01)
*H01L 21/3205* (2006.01)
(Continued)

(52) U.S. Cl.
CPC .. *H01L 21/02343* (2013.01); *H01L 21/02164* (2013.01); *H01L 21/02274* (2013.01);
(Continued)

(58) Field of Classification Search
CPC ......... H01L 21/02343; H01L 21/02164; H01L 21/02274; H01L 21/32051; H01L 21/3212; H01L 21/32133
See application file for complete search history.

(56) References Cited

U.S. PATENT DOCUMENTS

| 6,091,154 A | 7/2000 | Ohkawa ........................ 257/774 |
| 12,342,594 B2* | 6/2025 | Wu ........................ H01L 23/485 |

(Continued)

FOREIGN PATENT DOCUMENTS

| JP | 09283462 A | 10/1997 | ............. H01L 21/28 |
| JP | 10079430 A | 3/1998 | ............ H01L 21/768 |

OTHER PUBLICATIONS

International Search Report and Written Opinion, Application No. PCT/US2023/0015161, 14 pages.

*Primary Examiner* — Zandra V Smith
*Assistant Examiner* — Andre C Stevenson
(74) *Attorney, Agent, or Firm* — SLAYDEN GRUBERT BEARD PLLC

(57) ABSTRACT

A method of forming a partially silicided element is provided. A silicided structure including a silicide layer on a base structure is formed. A dielectric region is formed over the silicided structure. The dielectric region is etched to form a contact opening exposing a first area of the silicide layer and a tub opening exposing a second area of the silicide layer. A conformal metal is deposited to (a) fill the contact opening to define a contact and (b) form a cup-shaped metal structure in the tub opening. Another etch is performed to remove the cup-shaped metal structure in the tub opening, to remove the underlying silicide layer second area and to expose an underlying area of the base structure, wherein the silicide layer first area remains intact. The base structure with the intact silicide layer first area and removed silicide layer second area defines the partially silicided element.

19 Claims, 30 Drawing Sheets

(51) Int. Cl.
  *H01L 21/321* (2006.01)
  *H01L 21/3213* (2006.01)
(52) U.S. Cl.
  CPC .... *H01L 21/32051* (2013.01); *H01L 21/3212* (2013.01); *H01L 21/32133* (2013.01)

(56) References Cited

U.S. PATENT DOCUMENTS

| | | | |
|---|---|---|---|
| 2004/0070033 A1 | 4/2004 | Shin et al. | 257/379 |
| 2009/0078998 A1* | 3/2009 | Shi | H10D 30/0323 257/E21.24 |
| 2016/0358905 A1 | 12/2016 | Balakrishnan et al. | 257/379 |
| 2019/0355672 A1* | 11/2019 | Fujita | H01L 23/5226 |
| 2020/0365698 A1* | 11/2020 | Tsai | H10D 64/01 |

* cited by examiner

FIG. 6A

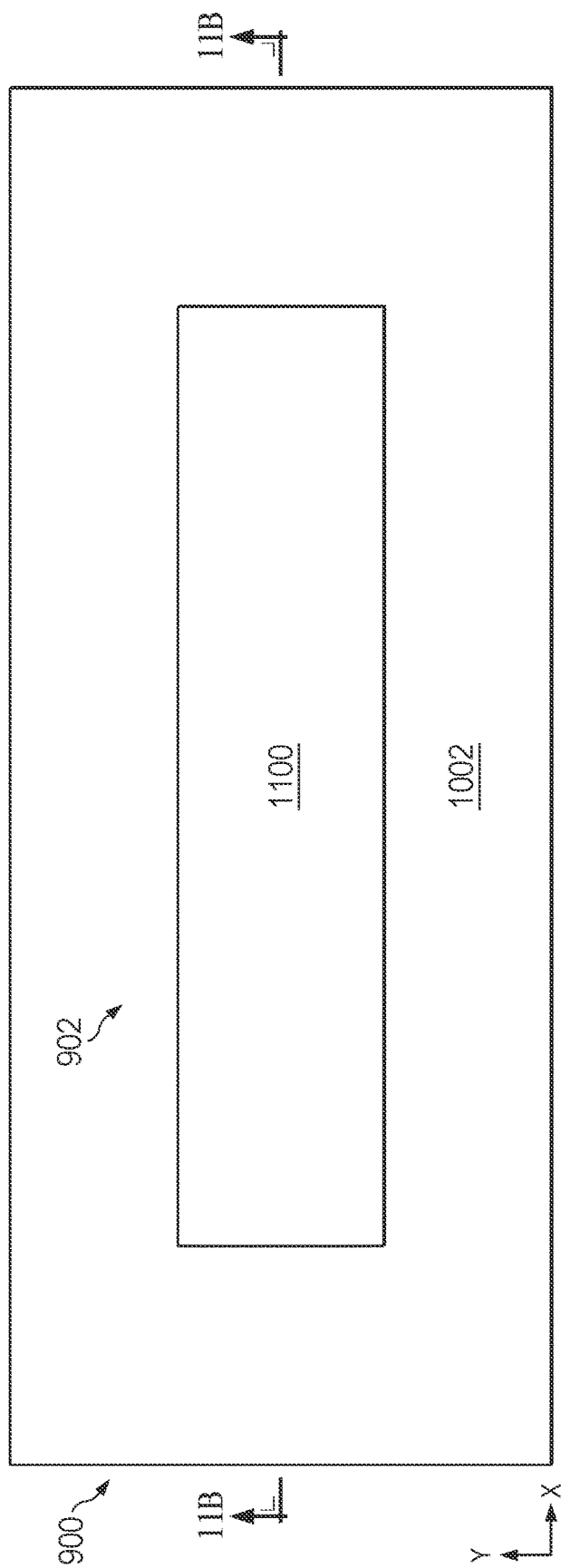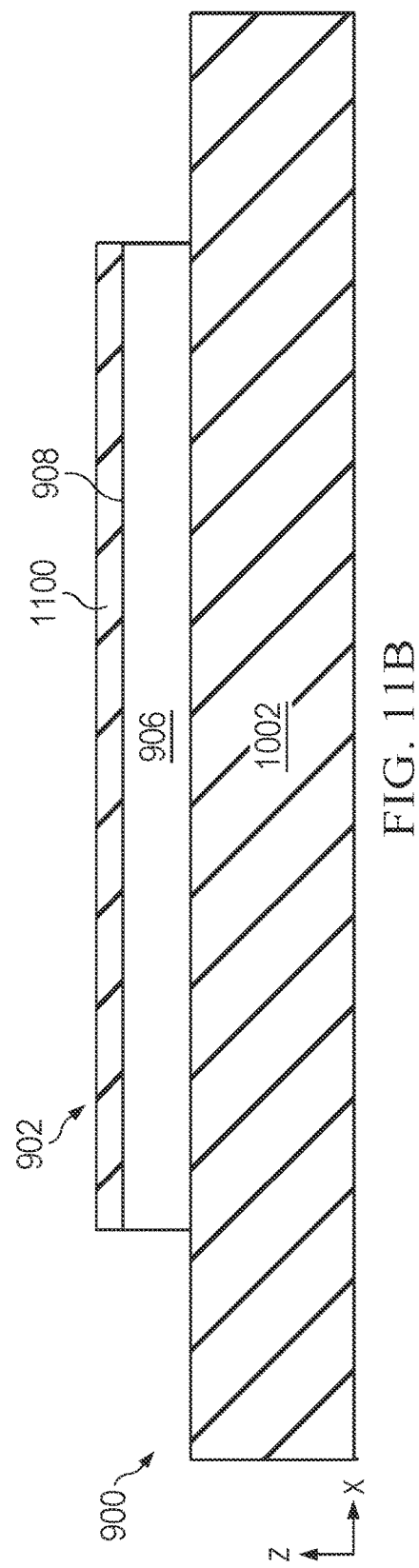
FIG. 11A
FIG. 11B

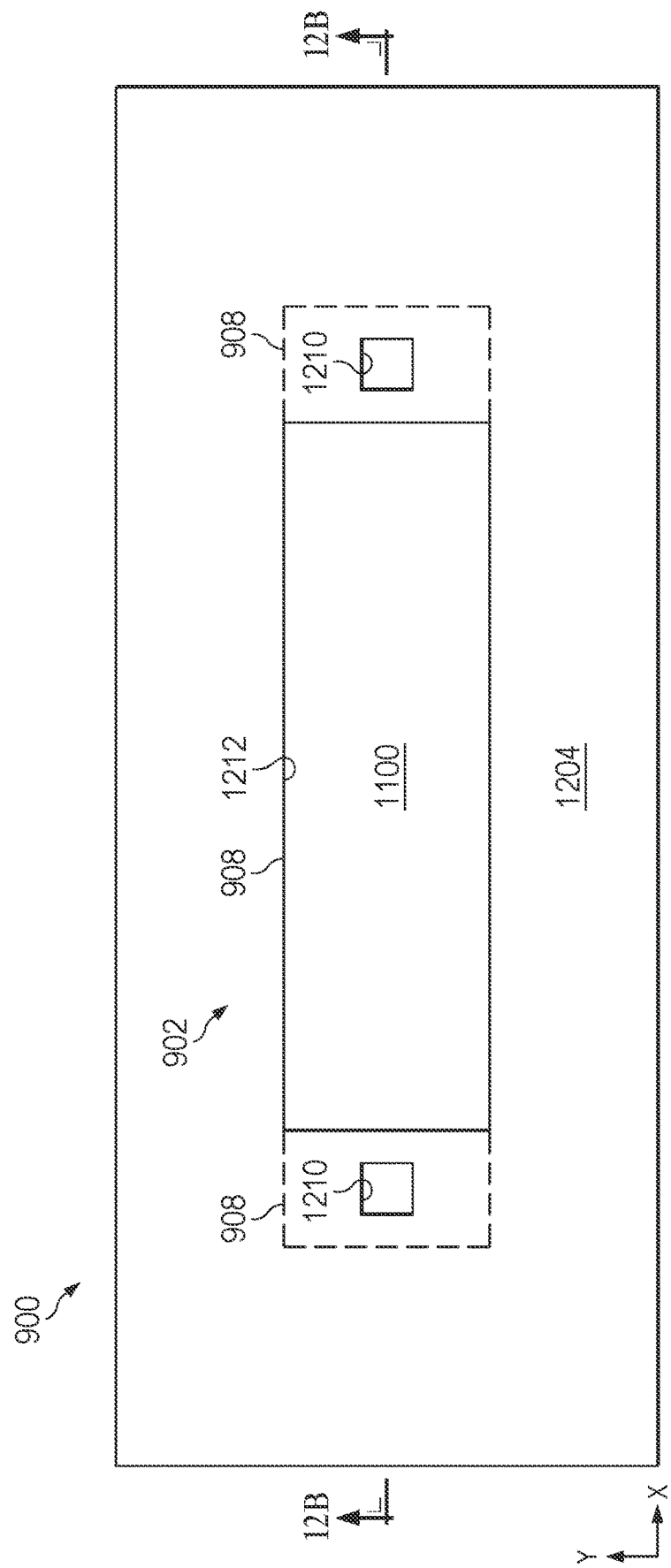

FORMING A PARTIALLY SILICIDED ELEMENT

RELATED APPLICATION

This application claims priority to commonly owned U.S. Provisional Patent Application No. 63/406,356 filed Sep. 14, 2022, the entire contents of which are hereby incorporated by reference for all purposes.

TECHNICAL FIELD

The present disclosure relates to integrated circuit (IC) devices, and more particularly to partially silicided elements and methods of forming partially silicided elements in IC devices.

BACKGROUND

Many IC devices include silicided elements, for example certain complementary metal oxide semiconductor (CMOS) transistors formed with a silicided poly gate and silicided source and drain region. A silicided element includes a metal silicide layer formed on a base structure, e.g., a polysilicon element or an active region, wherein the silicide layer exhibits increased conductance, e.g., to provide improved electrical contact with the underlying base structure. CMOS transistor structures are often formed as silicided elements, or example CMOS transistor gates ("poly gates") and CMOS transistor active regions (e.g., source and drain regions).

For some devices, silicidation may result in ineffective or undesirable performance. For example, CMOS transistors used in ESD (electrostatic discharge) circuits are typically not silicided, as silicidation may restrict high voltage capability. As another example, polysilicon resistors ("poly resistors") are typically formed without silicidation, in order to achieve desired sheet resistance values. However, it is often beneficial to silicide the respective contact areas for such devices, e.g., high voltage CMOS transistors and poly resistors, to improve electrical contact to the relevant device components. Thus, certain IC elements may be formed partially silicided, elements, wherein a "partially silicided" element refers to a base structure (e.g., a polysilicon structure or a doped silicon region) having a top surface including at least one silicided region (having a silicide layer formed thereon) and at least one non-silicided region (without a silicide layer formed thereon). As used herein, a "partially silicided" device, e.g., a partially silicided CMOS transistor or a partially silicided resistor, refers to a device including at least one partially silicided element.

Partially silicided elements are conventionally formed by blocking the formation of silicide on a partial surface area of the base structure top surface, typically with a thin layer of silicon oxide referred to as a silicide block layer or resistor protection oxide (RPO). In a typical silicide blocking process, a photo mask is used to etch away selected area of the silicide block layer, allowing silicidation of the exposed areas of the underlying base structure top surface, while preventing silicidation of areas of the base structure top surface covered by the silicide block layer. However, this silicide blocking process requires an additional photomask process, which adds significant cost to the relevant manufacturing process.

There is a need for improved methods of forming partially silicided elements.

SUMMARY

The present disclosure provides devices including example partially silicided elements and example methods of forming devices including partially silicided elements. Example types of partially silicided elements disclosed herein include (a) elements of a CMOS transistor (e.g., a partially silicided poly gate, a partially silicided source region, and a partially silicided drain region), and (b) a partially silicided resistive element of an integrated resistor. In some examples, partially silicided elements may be formed concurrently with respective fully silicided elements. For example, a partially silicided CMOS transistor may be formed concurrently with a fully silicided CMOS transistor.

Some examples provide a process of forming a partially silicided element that eliminates the need for a silicide block layer (or RPO) used in conventional processes, which may reduce manufacturing costs. In some examples a partially silicided element may be formed without adding any mask layers to the background or baseline manufacturing process of the relevant IC device.

One aspect provides a method of forming a partially silicided element. A silicided structure is formed, including a silicide layer on a base structure. A dielectric region is formed over the silicided structure. A first etch process is performed to form a contact opening and a tub opening in the dielectric region, the contact opening exposing a first area of the silicide layer, and the tub opening exposing a second area of the silicide layer. A conformal metal is deposited over the dielectric region, the deposited conformal metal (a) filling the contact opening to define a contact conductively connected to the first area of the silicide layer and (b) forming a cup-shaped metal structure in the tub opening. A second etch process is performed to remove the cup-shaped metal structure in the tub opening, to remove the second area of the silicide layer, and to expose an area of the base structure under the second area of the silicide layer, wherein the first area of the silicide layer remains intact after the second etch process. The base structure with the intact first area of the silicide layer and the removed second area of the silicide layer defines the partially silicided element.

In some examples, the base structure comprises a polysilicon element. For example, the base structure may comprise a polysilicon gate of a transistor, or a polysilicon resistor element.

In other examples, the base structure comprises an active region of a transistor, e.g., a doped source region or a doped drain region.

In some examples, the conformal metal comprises tungsten.

In some examples, the method includes filling the tub opening with a dielectric fill material after the second etch process.

In some examples, the second etch process includes (a) a conformal metal etch to remove the cup-shaped metal structure from the tub opening and (b) a silicide etch to remove the second area of the silicide layer.

In some examples, the dielectric region formed over the silicided structure includes a base dielectric layer and a sacrificial dielectric layer over the base dielectric layer; the second etch process removes an upper portion of the contact having a vertical depth extending partially through a vertical thickness of the sacrificial dielectric layer, and the method includes filling the tub opening with a dielectric fill material after the second etch process, and performing a planarization process to remove an upper portion of the dielectric fill material and a remaining portion of the sacrificial dielectric layer.

In some examples, the dielectric base layer and the sacrificial dielectric layer comprise respective portions of a dielectric material deposited over the silicided structure.

In other examples, the base dielectric layer comprises a first dielectric material and the sacrificial dielectric layer comprises a second dielectric material different than the first dielectric material.

In some examples, a lateral width of the tub opening is greater than a lateral width of the contact opening.

In some examples, the contact opening has a lateral width in the range of 0.1-0.5 µm, and the tub opening has a lateral width in the range of 1-100 µm.

One aspect provides a device including a partially silicided element including a base structure having a top surface including a silicided region and a non-silicided region. The silicided region of the top surface of the base structure is covered by a silicide layer, and the non-silicided region of the top surface of the base structure is not covered by the silicide layer. A vertical height of the silicided region of the top surface of the base structure is equal to or greater than a vertical height of the non-silicided region of the top surface of the base structure.

In some examples, the base structure comprises a polysilicon element. For example, the base structure may comprise a polysilicon gate of a transistor, or a polysilicon resistor element.

In other examples, the base structure comprises an active region of a transistor, e.g., a doped source region or a doped drain region.

In some examples, the device further includes a fully silicided element including a second base structure having a second top surface fully covered by a second silicide layer, wherein the base structure of the partially silicided element and the second base structure of the fully silicided element comprise respective portions of a common material layer.

One aspect provides a method of forming an integrated circuit (IC) device including (a) a partially silicided element and (b) a fully silicided element. A first silicided structure and a second silicided structure are formed, the first silicided structure including a first silicide layer formed on a first base structure, and the second silicided structure including a second silicide layer formed on a second base structure. A dielectric region is formed over the first and second silicided structures. A first etch process is performed to form a first contact opening, a second contact opening, and a tub opening in the dielectric region, wherein the first contact opening exposes the first silicide layer, the second contact opening exposes a first area of the second silicide layer, and the tub opening exposes a second area of the second silicide layer. A conformal metal is deposited over the dielectric region, the deposited conformal metal layer (a) filling the first contact opening to define a first contact conductively connected to the first silicide layer, (b) filling the second contact opening to define a second contact conductively connected to the first area of the second silicide layer, and (c) forming a cup-shaped metal structure in the tub opening. A second etch process is performed to remove the cup-shaped metal structure in the tub opening, to remove the second area of the second silicide layer, and to expose an area of the second base structure under the second area of the second silicide layer, wherein the first silicide layer and the first area of the second silicide layer remain intact after the second etch process. The tub opening is filled with a dielectric fill material. The first base structure with the intact first silicide layer defines the fully silicided element, and the second base structure with the intact first area of the second silicide layer and the removed second area of the second silicide layer defines the partially silicided element.

In some examples, the dielectric region formed over the first and second silicided structures includes a base dielectric layer and a sacrificial dielectric layer over the base dielectric layer; the second etch process removes an upper portion of the first contact and an upper portion of the second contact respectively having a vertical depth extending partially through a vertical thickness of the sacrificial dielectric layer; and the method includes, after filling the tub opening with the dielectric fill material, performing a planarization process to remove remaining portions of the sacrificial dielectric layer.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure describes example partially silicided elements and example methods of forming partially silicided elements. Respective elements of different types of IC structures may be formed as partially silicided elements. For example, as discussed below regarding FIGS. 1A-1G through FIG. 8, elements of a CMOS transistor, for example a poly gate, a source region, and a drain region, may be formed as partially silicided elements, wherein such a CMOS transistor structure may be referred to as a partially silicided CMOS transistor. In other examples, e.g., as discussed below regarding FIGS. 9A-9B through FIGS. 15A-15B, a resistor may include a resistive element formed as a partially silicided element, wherein such resistor may be referred to as a partially silicided resistor. As discussed below, in some examples, partially silicided CMOS transistors or partially silicided resistors may be formed concurrently with fully silicided elements (e.g., fully silicided CMOS transistors) in respective IC devices.

Figure 1A:
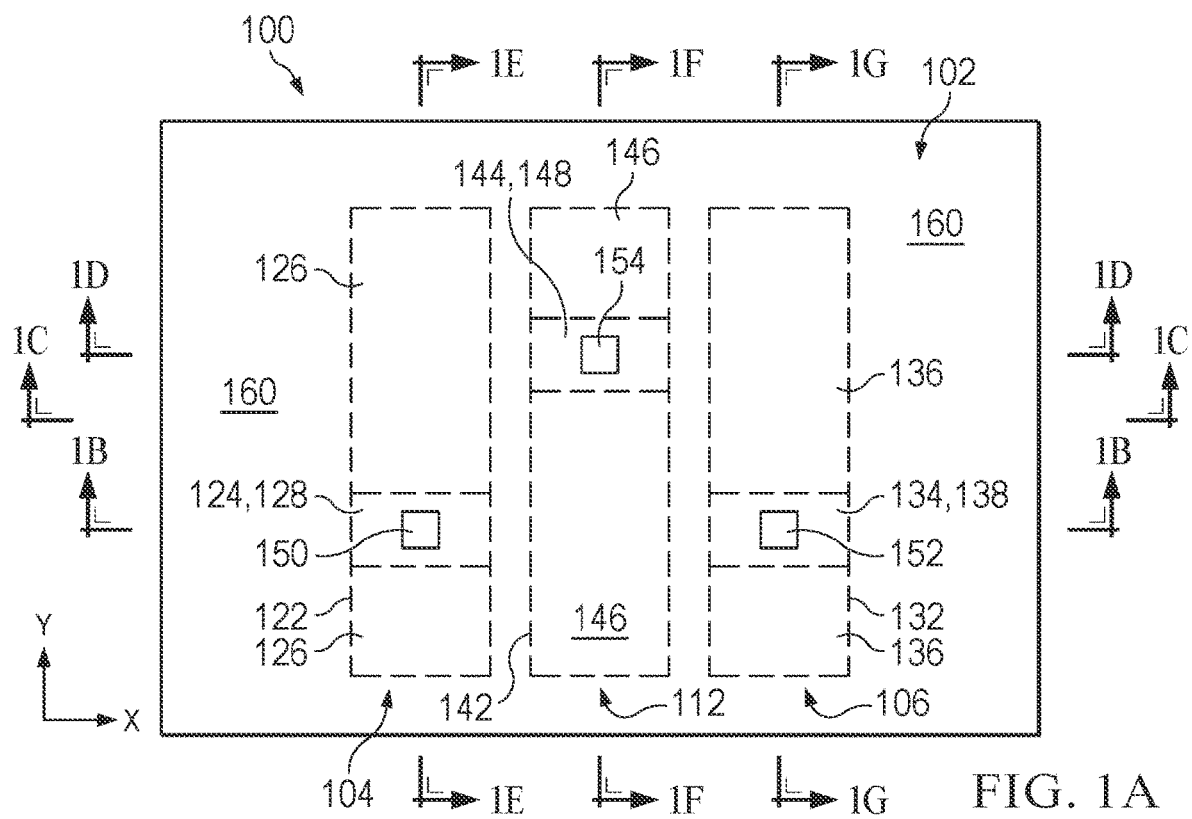
FIGS. 1A-1G show an example IC device including a partially silicided CMOS transistor, including a partially silicided poly gate and partially silicided source and drain regions.
Figure 1B:
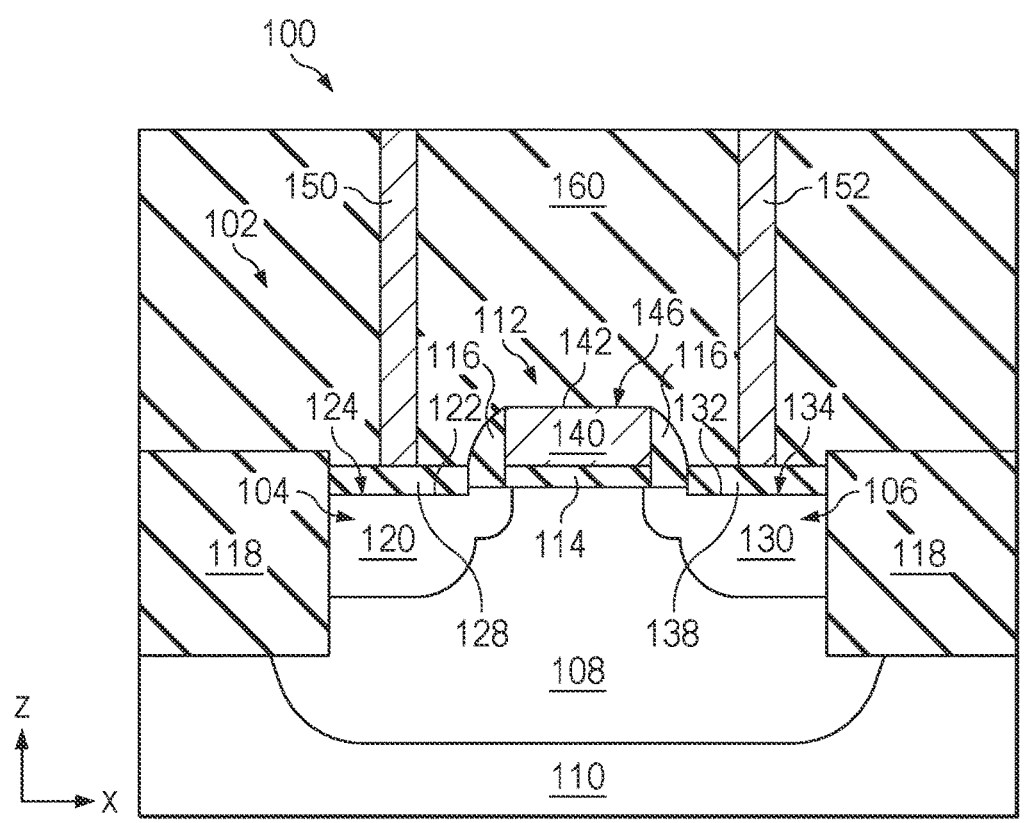
Figures 1C, 1D:
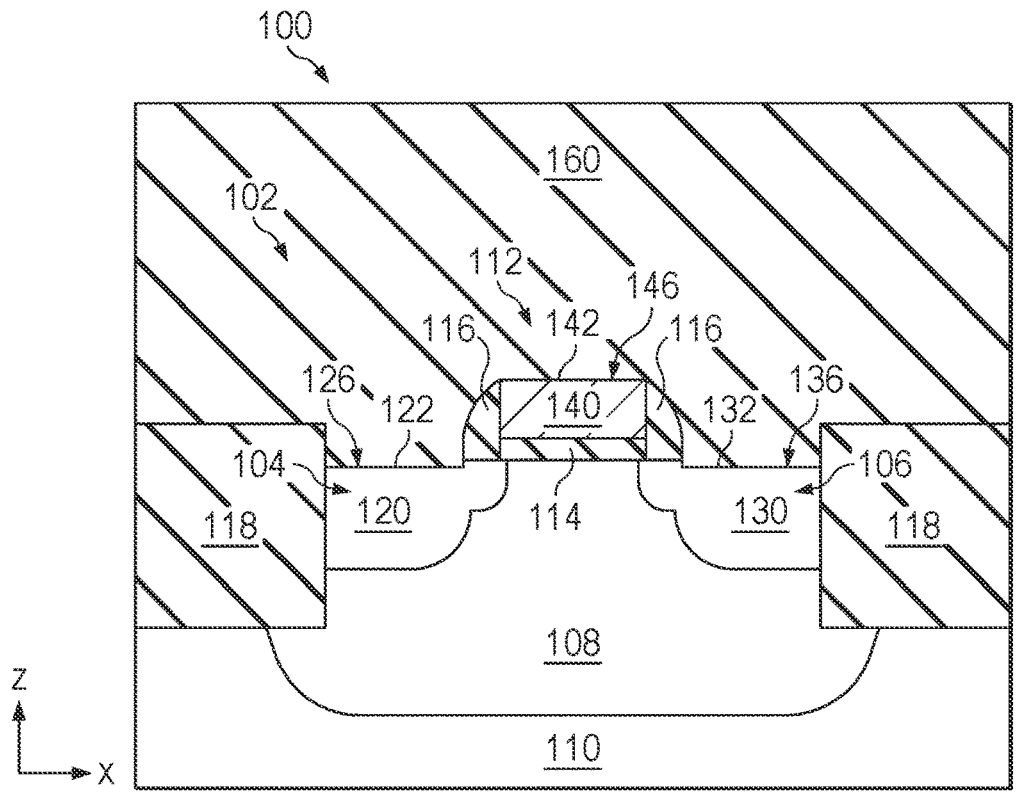

FIGS. 1A-1G show an example IC device 100 including an example partially silicided CMOS transistor 102, according to one example. In particular, FIG. 1A shows a top view of the example IC device 100, and FIGS. 1B, 1C, 1D, 1E, 1F, and 1G show cross-sectional side views through respective cut lines 1B-1B, 1C-1C, 1D-1D, 1E-1E, 1F-1F, and 1G-1G shown in FIG. 1A.

As shown, the example partially silicided CMOS transistor 102 includes a source region 104 and a drain region 106 formed in a doped well region 108 formed over a substrate 110, and a polysilicon gate (or "poly gate") 112 formed over a gate oxide region 114. The source region 104 and drain region 106 may respectively comprise doped silicon regions, and may be referred to as "active regions" of the CMOS transistor 102. The substrate 110 may comprise a silicon substrate, and may include an epitaxial layer. Sidewall spacers 116, e.g., comprising silicon nitride (SiN), may be formed on lateral sides of the poly gate 112. The partially silicided CMOS transistor 102 may be formed laterally between or adjacent respective shallow trench insulation (STI) field oxide regions 118.

In this example, the source region 104, the drain region 106, and the poly gate 112 are formed as partially silicided elements, and may thus be referred to as partially silicided source region 104, partially silicided drain region 106, and partially silicided poly gate 112. The respective partially silicided elements 104, 106, and 112 include a respective base structure having a top surface including at least one respective silicided region and at least one respective non-silicided region. In the illustrated example, the partially silicided source region 104 includes a base structure 120 having a top surface (base structure top surface) 122 including at least one silicided region 124 and at least one non-silicided region 126; the partially silicided drain region 106 includes a base structure 130 (comprising doped silicon) having a top surface (base structure top surface) 132 including at least one silicided region 134 and at least one non-silicided region 136; and the partially silicided poly gate 112 includes a base structure 140 having a top surface (base structure top surface) 142 including at least one silicided region 144 and at least one non-silicided region 146. The respective base structures 120 and 130 of the partially silicided source region 104 and partially silicided drain region 106 comprise a respective active region, i.e., a respective doped silicon region. The base structure 140 of the partially silicided poly gate 112 comprises a polysilicon element.

As used herein, a "silicided region" of a respective base structure top surface refers to a region of the base structure top surface that is covered by a silicide layer, and a "non-silicided region" of respective base structure top surface refers to a region of the base structure top surface that is not covered by a silicide layer, e.g., as a result of a silicide layer removal process as disclosed herein. Thus, for example, as shown in FIGS. 1A-1G, the base structure top surface 122 of the partially silicided source region 104 includes a silicided region 124 covered by a silicide layer area 128 arranged between (laterally along the y-direction) a pair of non-silicided regions 126 not covered by the silicide layer area 128. Similarly, the base structure top surface 132 of the partially silicided drain region 106 includes a silicided region 134 covered by a silicide layer area 138 arranged between (laterally along the y-direction) a pair of non-silicided regions 136 not covered by the silicide layer area 138. Similarly, the base structure top surface 142 of the partially silicided poly gate 112 includes a silicided region 144 covered by a silicide layer area 148 arranged between (laterally along the y-direction) a pair of non-silicided regions 146 not covered by the silicide layer area 148.

In some examples, respective silicide layer areas 128, 138, and 148 may comprise titanium silicide (TiSi2), cobalt silicide (CoSi2), or nickel silicide (NiSi), having a thickness (z-direction) in the range of 50-300 Å.

The example IC device 100 also includes a dielectric region 160 formed over the partially silicided CMOS transistor 102, and vertically-extending contacts 150, 152, 154 formed in the dielectric region 160 and conductively connected to the silicided regions 124, 134, and 144, respectively, to provide conductive contact to the source region 104, drain region 106, and poly gate 112 of the CMOS transistor 102. Thus, as shown in FIGS. 1A through 1G, the base structure top surfaces 122, 132, and 142 of the source region 104, drain region 106, and poly gate 112 may be formed with (a) silicided regions 124, 134, and 144 near the respective locations of the contacts 150, 152, 154 (e.g., in the y-direction) to provide conductive contact with the contacts 150, 152, 154, and (b) non-silicided regions 126, 136, and 146 at locations further away (e.g., in the y-direction) from the contacts 150, 152, 154. As shown in FIG. 1A, in some examples the contacts 150, 152, 154 may be formed offset or spaced apart from each other in the y-direction, e.g., to avoid or reduce possible parasitic interaction between the silicided regions 124, 134, and 144.

It should be noted that the top view of FIG. 1A shows selected elements of the example IC device 100, but does not show certain other elements shown in FIGS. 1B-1G, for the purposes of simplified illustration. For example, FIG. 1A shows the base structure top surfaces 122, 132, and 142 of the source region 104, drain region 106, and poly gate 112, including the silicided regions 124, 134, and 144 and non-silicided regions 126, 136, and 146, as well as the contacts 150, 152, 154, but does not explicitly show the base structures 120, 130, and 140, the gate oxide region 114, the sidewall spacers 116, the STI field oxide regions 118, the doped well region 108, or the substrate 110.

As discussed below, e.g., with reference to FIGS. 3A-3B through FIG. 8, the silicided regions 124, 134, and 144 and non-silicided regions 126, 136, and 146 may be formed or defined by a process including forming respective silicide layers on the base structure top surfaces 122, 132, and 142 of the source region 104, drain region 106, and poly gate 112, and selectively removing partial areas of the respective silicide layers, wherein the areas in which the respective silicide layers are removed define the non-silicided regions 126, 136, and 146, and the areas in which the respective silicide layers remain intact define the silicided regions 124, 134, and 144 including silicide layer areas 128, 138, and 148, respectively. Such process may be referred to as a partial silicide layer removal process.

Figure 1E:
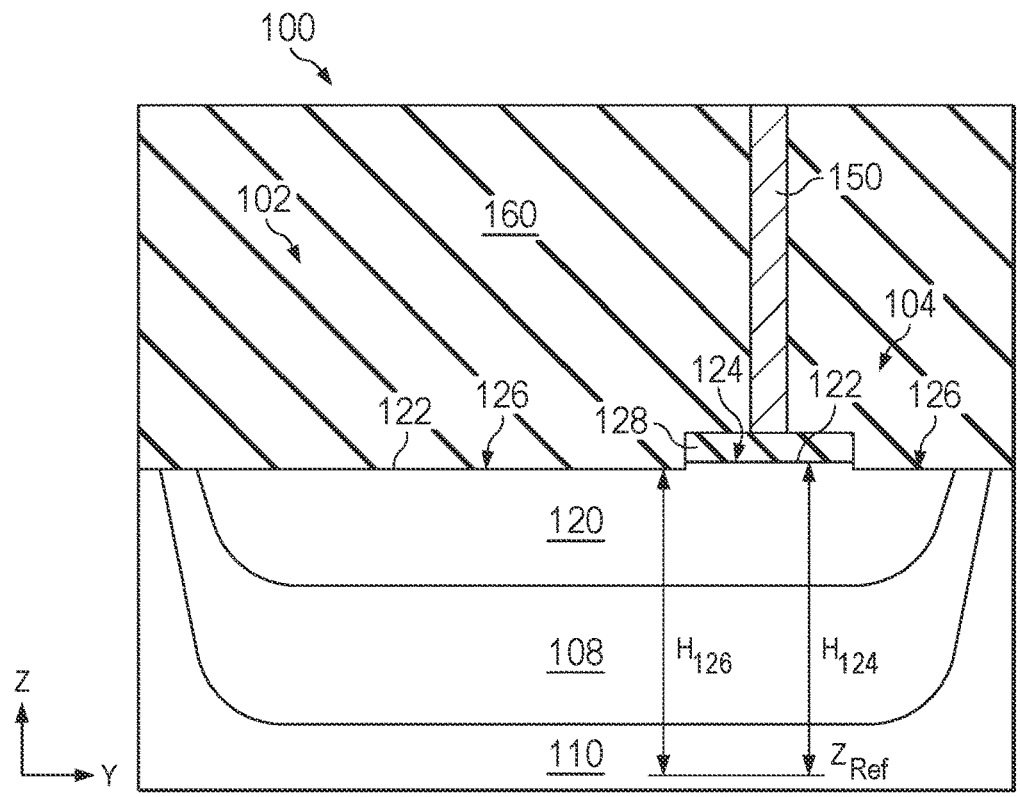

In some examples, as a result of a partial silicide layer removal process (e.g., the process shown in FIGS. 3A-3B through FIG. 8, discussed below), the silicided regions 124, 134, and 144 of the respective base structure top surfaces 122, 132, and 142 are located coplanar with, or above, the corresponding non-silicided regions 126, 136, and 146, in the z-direction. For example, as shown in FIG. 1E, a vertical height $H_{124}$ of the silicided region 124 of the top surface 122 of the base structure 120 of source region 104 (measured from an arbitrary reference plane $Z_{Ref}$) is located coplanar with, or above, a vertical height $H_{126}$ of the non-silicided regions 126 of the top surface 122. In some examples, the vertical height $H_{126}$ of the non-silicided regions 126 may be less than the vertical height $H_{124}$ of the silicided region 124 as a result of overetch (during an etch process to remove the removed areas 128' of the respective silicide layer) extending down into the underlying base structure 120 (doped silicon region).

Figure 1F:
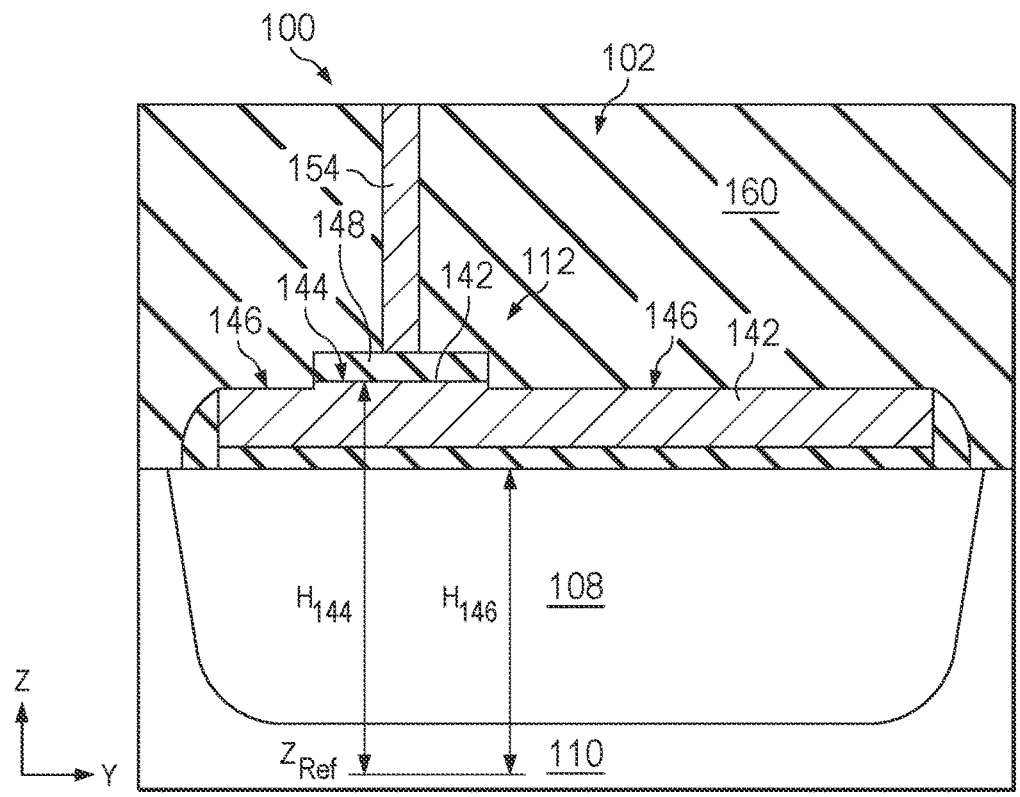

Also, as shown in FIG. 1F, a vertical height $H_{144}$ of the silicided region 144 of the top surface 142 of the base structure 140 of the poly gate 112 is located coplanar with, or above, a vertical height $H_{146}$ of the non-silicided regions 146 of the top surface 142. In some examples, the vertical height $H_{146}$ of the non-silicided regions 146 may be less than the vertical height $H_{144}$ of the silicided region 144 as a result of overetch extending down into the underlying base structure 140 (polysilicon element).

Figure 1G:
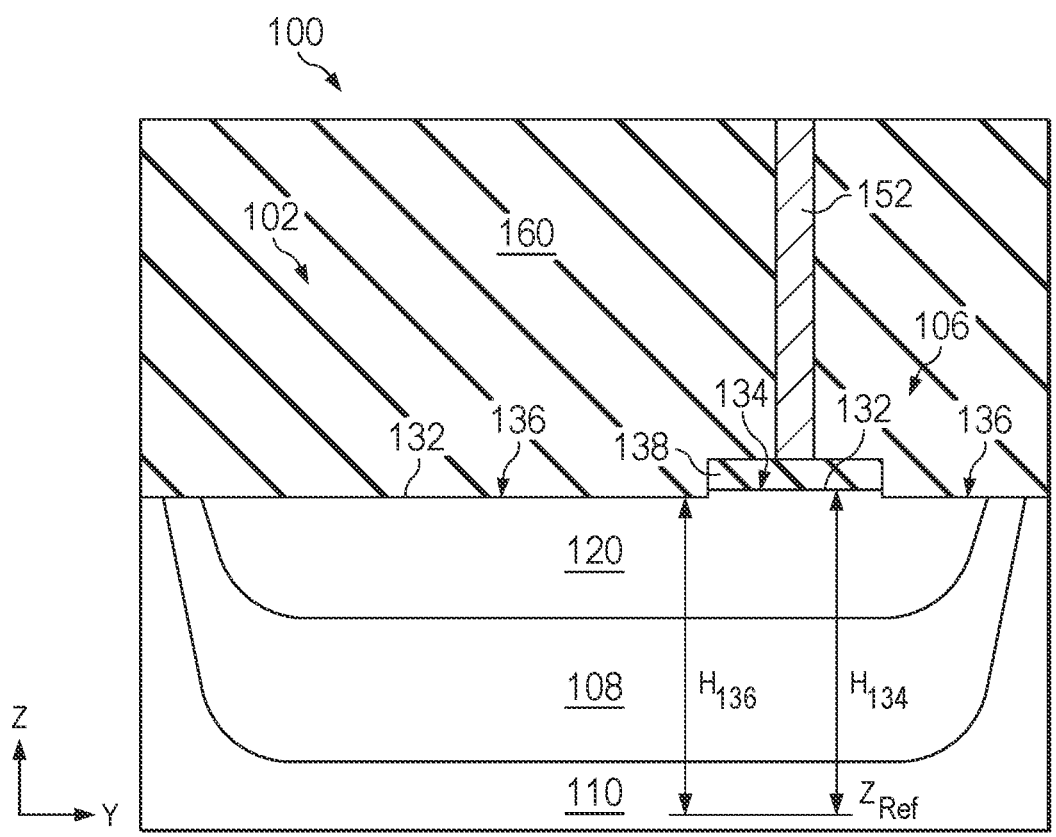

Also, as shown in FIG. 1G, a vertical height $H_{134}$ of the silicided region 134 of the top surface 132 of the base structure 130 of drain region 106 is located coplanar with, or above, a vertical height $H_{136}$ of the non-silicided regions 136 of the top surface 132. In some examples, the vertical height $H_{136}$ of the non-silicided regions 136 may be less than the vertical height $H_{134}$ of the silicided region 134 as a result of overetch extending down into the underlying base structure 130 (doped drain region).

In contrast to the partially silicided CMOS transistor 102 disclosed herein, partially silicided elements formed according to conventional techniques typically utilize a silicide blocking layer formed on the base structure, wherein non-blocked regions are silicided and blocked regions are not, resulting in the base structure having a top surface that is lower in the silicided regions than in the non-silicided regions, due to the silicidation process consuming some vertical thickness of the base structure.

Figure 2A:
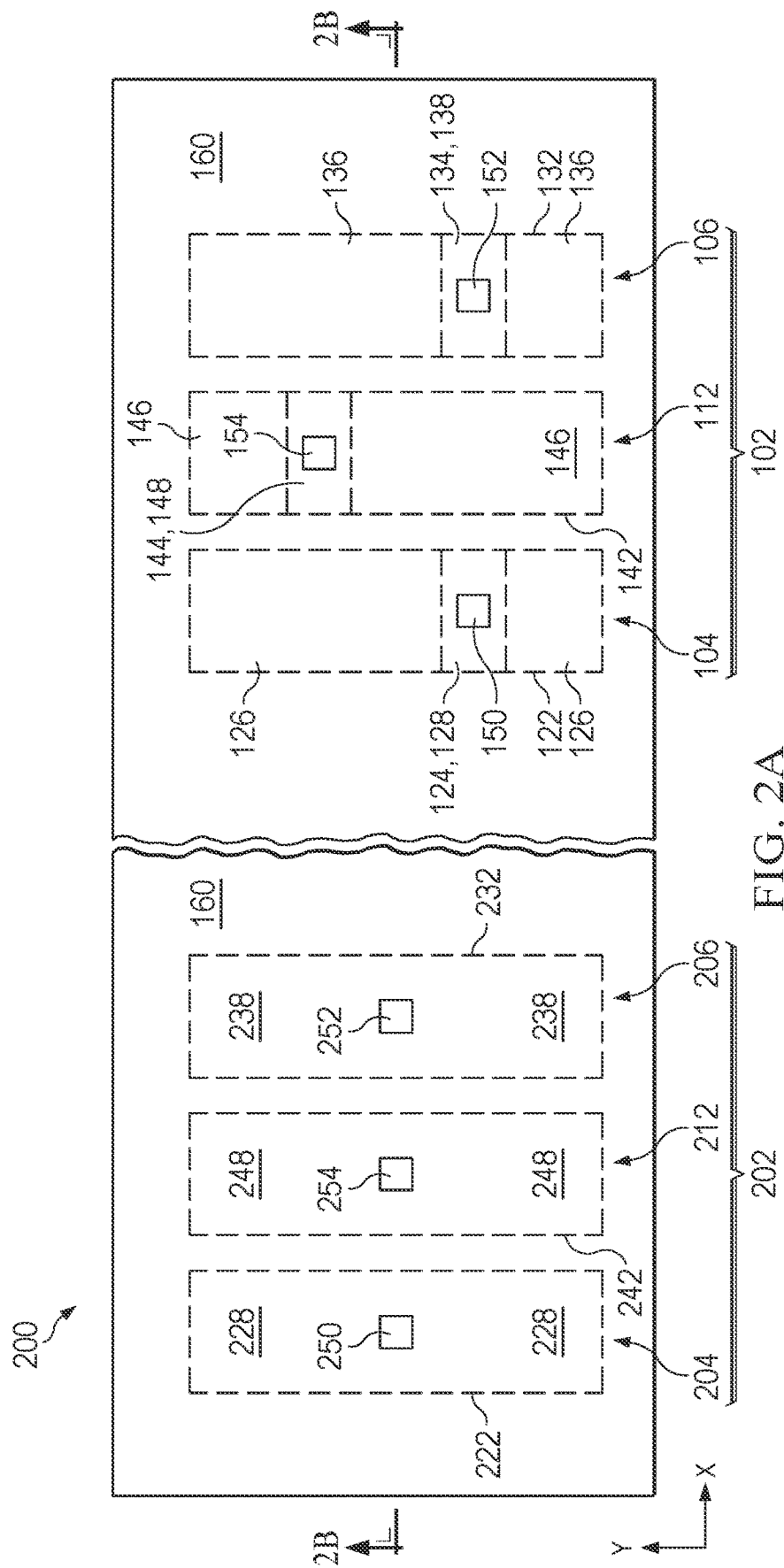
FIGS. 2A and 2B show an example IC device including (a) the example partially silicided CMOS transistor structure shown in FIGS. 1A-1G and (b) an example fully silicided CMOS transistor structure.
Figure 2B:
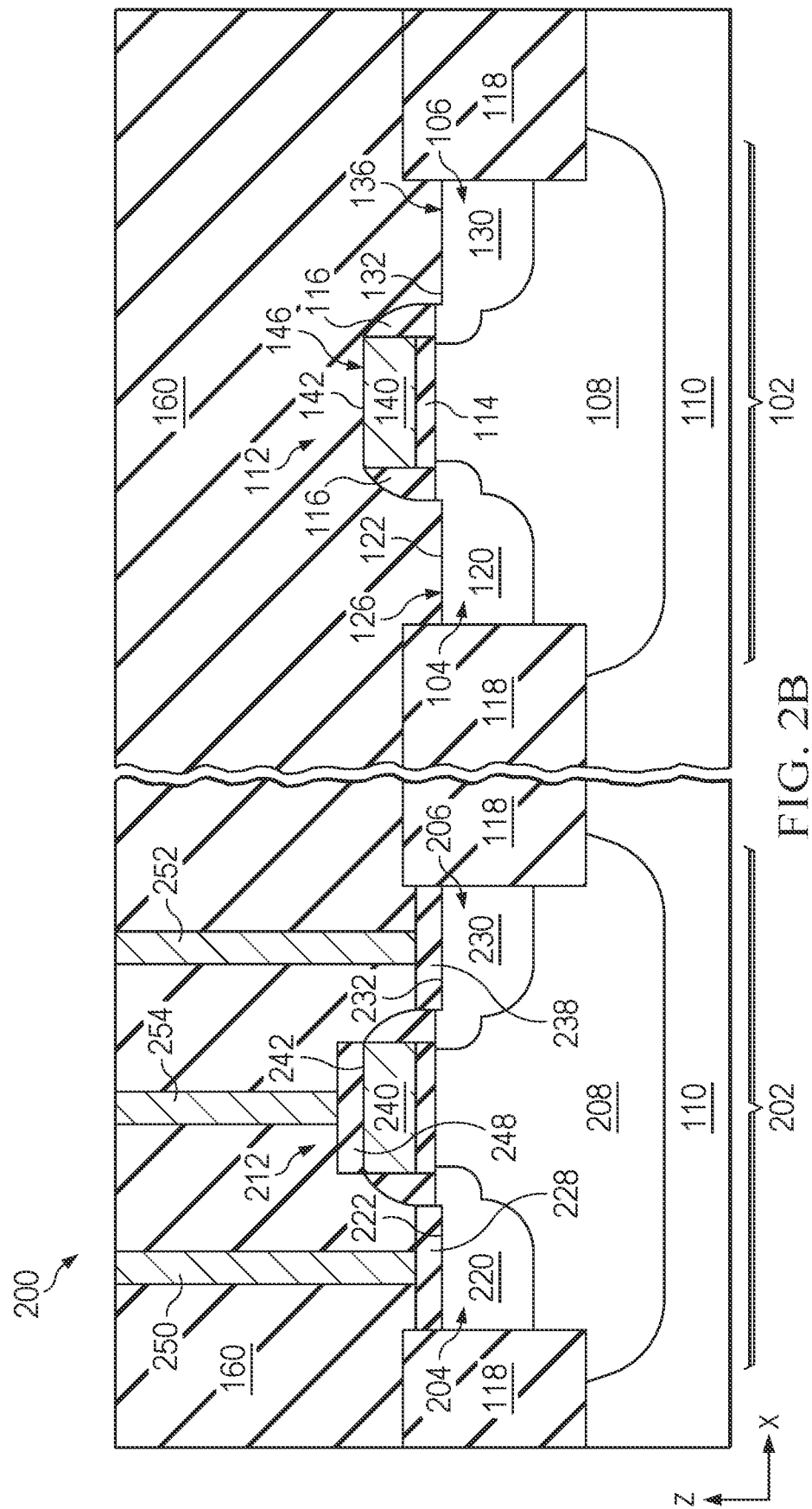

FIGS. 2A and 2B show an example IC device 200 including (a) the example partially silicided CMOS transistor structure 102 shown in FIGS. 1A-1G and (b) an example fully silicided CMOS transistor structure 202. FIG. 2A shows a top view of the example IC device 200, and FIG. 2B shows a cross-sectional side view through cut lines 2B-2B shown in FIG. 2A. The partially silicided CMOS transistor structure 102 and fully silicided CMOS transistor structure 202 may be formed concurrently, e.g., according to the example process shown in FIGS. 3A-3B through FIG. 8 discussed below.

As discussed above, the example partially silicided CMOS transistor 102 includes (among other elements) the partially silicided source region 104, partially silicided drain region 106, and partially silicided poly gate 112. The partially silicided source region 104 includes base structure 120 (doped silicon source region) having top surface 122 including silicided region 124 located between (in the y-direction) non-silicided regions 126; partially silicided drain region 106 includes base structure 130 (doped silicon drain region) having top surface 132 including silicided region 134 located between (in the y-direction) non-silicided regions 136; and partially silicided poly gate 112 includes base structure 140 (polysilicon element) having top surface 142 including silicided region 144 located between (in the y-direction) non-silicided regions 146. As shown in FIG. 2A, vertically-extending contacts 150, 152, and 154 formed in the dielectric region 160 are conductively connected to silicided regions 124, 134, and 144, respectively, to provide conductive contact to the source region 104, drain region 106, and poly gate 112 of the partially silicided CMOS transistor 102.

The example fully silicided CMOS transistor 202 includes (among other elements) a fully silicided source region 204, a fully silicided drain region 206, and a fully silicided poly gate 212. The fully silicided source region 204 includes a base structure 220 (a doped silicon source region) having a top surface 222 having a silicide layer 228 extending along a full length (in the y-direction) of the top surface 222. The fully silicided drain region 206 includes a base structure 230 (a doped silicon drain region) having a top surface 232 having a silicide layer 238 extending along a full length (in the y-direction) of the top surface 232. The base structure 220 (doped source region) and base structure 230 (doped drain region) are formed over a doped well region 208 over the substrate 110.

The fully silicided poly gate 212 includes a base structure 240 (a polysilicon element) having a top surface 242 having a silicide layer 248 extending along a full length (in the y-direction) of the top surface 242. The base structure 220 (doped silicon source region) and base structure 230 (doped silicon drain region) of the fully silicided CMOS transistor 202, and the base structure 120 (doped silicon source region) and base structure 130 (doped silicon drain region) of the partially silicided CMOS transistor 102 may comprise respective regions of a common substrate 110 (e.g., silicon substrate). Also, the base structure 240 (polysilicon element) of the fully silicided CMOS transistor 202 and the base structure 140 (polysilicon element) of the partially silicided CMOS transistor 102 may comprise portions of a common (same) polysilicon layer, e.g., wherein polysilicon elements 140 and 240 are formed concurrently.

Vertically-extending contacts 250, 252, 254 and formed in the dielectric region 160 are conductively connected to the silicide layers 228, 238, and 248, respectively, to provide conductive contact to the source region 204, drain region 206, and poly gate 212 of the fully silicided CMOS transistor 102.

Figure 3A:
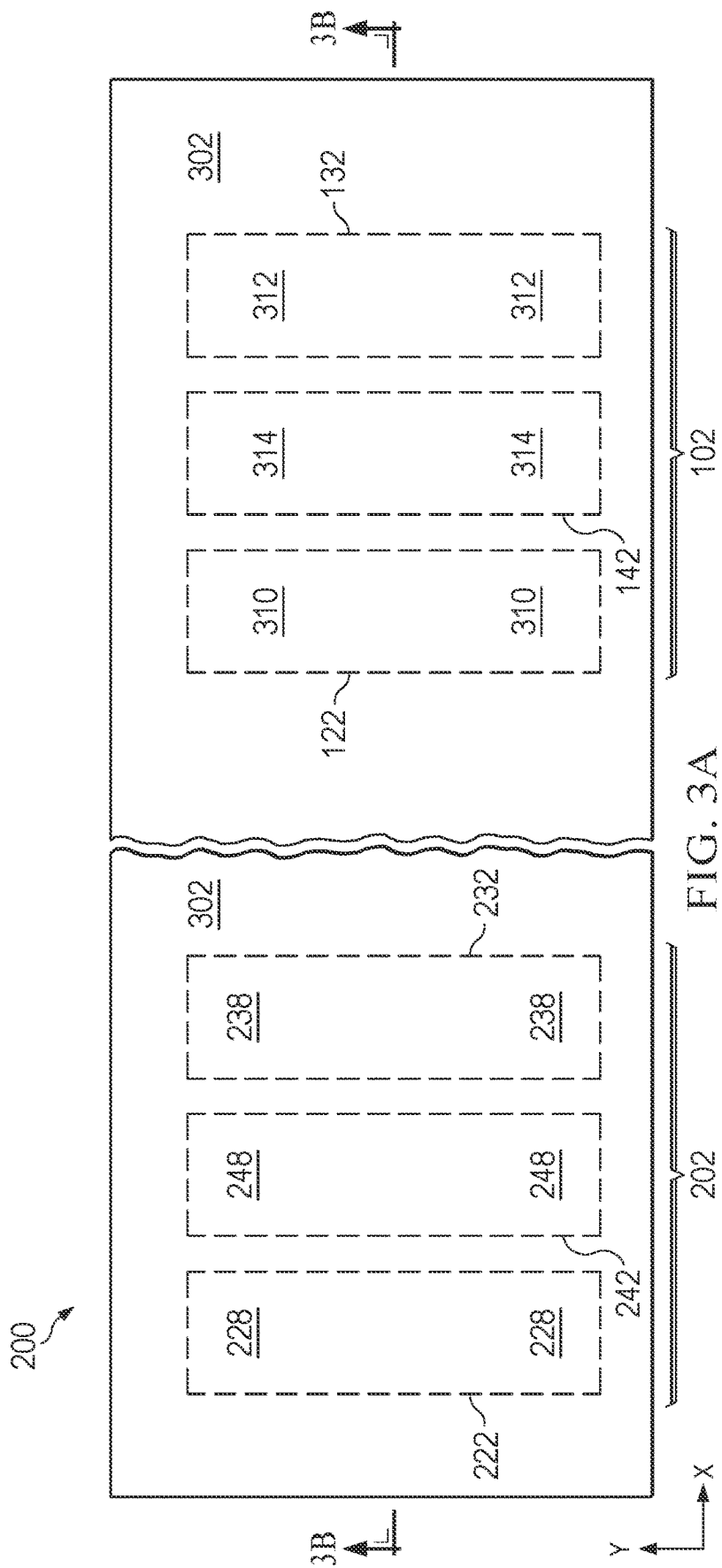
FIGS. 3A-3B through FIG. 8 illustrate an example method of forming the example IC device (including the partially silicided CMOS transistor structure and fully silicided CMOS transistor structure) shown in FIGS. 2A and 2B.
Figure 3B:
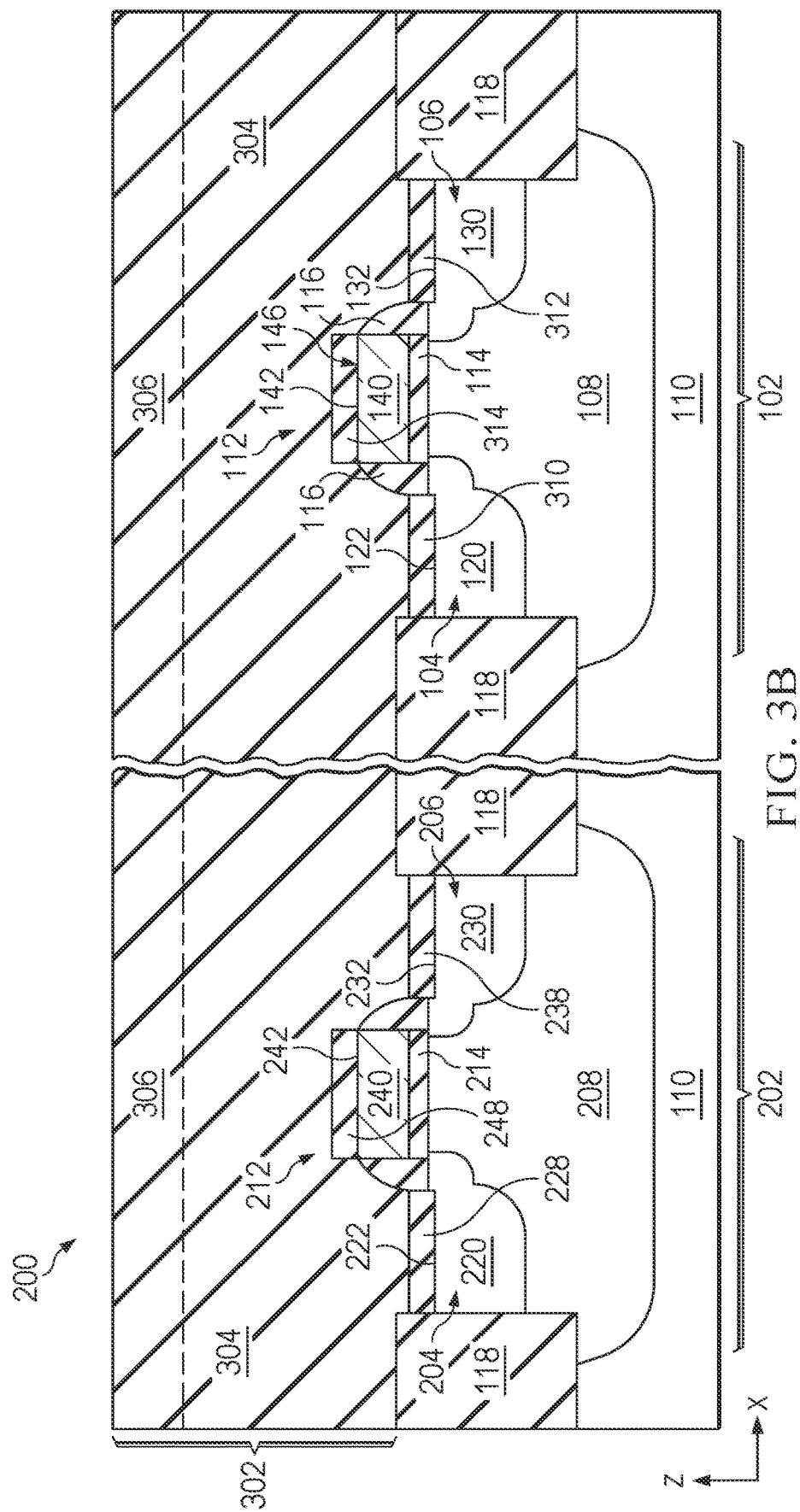
Figure 8:
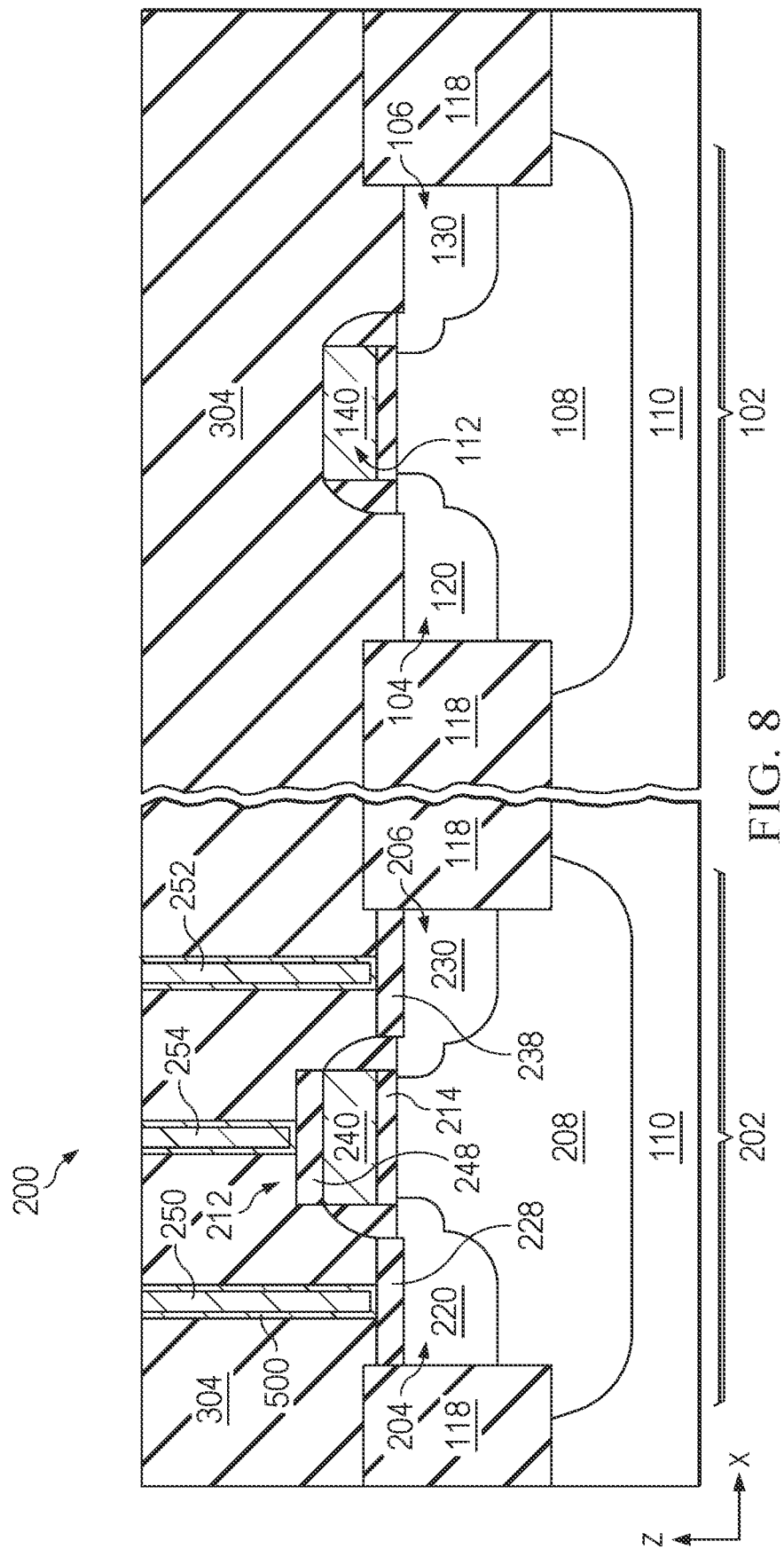

FIGS. 3A-3B through FIG. 8 illustrate an example method of forming the example IC device 200 shown in FIGS. 2A and 2B, including the partially silicided CMOS transistor structure 102 and the fully silicided CMOS transistor structure 202. As explained below, the partially silicided CMOS transistor structure 102 is initially formed with fully silicided elements (e.g., the source region 104, drain region 106, and poly gate 112), and a partial silicide removal process is performed to remove partial areas of the respective silicide layers to define the respective silicided regions 124, 134, and 144 and non-silicided regions 126, 136, and 146 of the source region 104, drain region 106, and poly gate 112.

As shown in FIG. 3A (top view) and FIG. 3B (cross-sectional side view through line 3B-3B shown in FIG. 3A), various structures of the partially silicided CMOS transistor structure 102 and fully silicided CMOS transistor structure 202 are formed over substrate 110. For example, for the partially silicided CMOS transistor 102 being formed, the base structure 120 (doped source region) of the source region 104 and the base structure 130 (doped drain region) of the drain region 106 are formed over the doped well region 108 over the substrate 110, and the polysilicon element 140 of the poly gate 112 is formed over the gate oxide region 114. Respective silicide layers 310, 312, and 314 are formed on the top surfaces 122, 132, and 142 of the base structures 120, 130, and 140, respectively. In some examples, respective silicide layers 310, 312, and 314 may comprise titanium silicide (TiSi2), cobalt silicide (CoSi2), or nickel silicide (NiSi), having a thickness (z-direction) in the range of 50-300 Å.

For the fully silicided CMOS transistor 202 being formed, the base structure 220 (doped source region) of the source region 204 and the base structure 230 (doped drain region) of the drain region 206 are formed over a doped well region 208 over the substrate 110, and the polysilicon element 240 of the poly gate 212 is formed over a gate oxide region 214. The silicide layers 228, 238, and 248 are formed on the top surfaces 222, 232, and 242 of the base structures 220, 230, and 240, respectively.

A dielectric region 302 is formed through a combination of deposition and CMP processes over the partially silicided CMOS transistor structure 102 and fully silicided CMOS transistor 202 being formed. The dielectric region 302 may include a base dielectric layer 304 and a sacrificial dielectric layer 306 over the base dielectric layer 304. In some examples, the base dielectric layer 304 represents a pre-metal dielectric (PMD) region and the sacrificial dielectric layer 306 represents a partial vertical thickness (z-direction) of the dielectric region 302 that is removed by a subsequent planarization process, e.g., as shown in FIG. 8, discussed below. In some examples, the dielectric region 302 is a continuous region of a dielectric material, e.g., deposited in a single deposition process, wherein the dielectric base layer 304 and the sacrificial dielectric layer 306 comprise respective portions (with respective partial thicknesses) of the deposited dielectric material. In other examples, the base dielectric layer 304 comprises a first dielectric material and the sacrificial dielectric layer 306 comprises a second dielectric material different than the first dielectric material, e.g., wherein the base dielectric layer 304 is deposited by a first deposition process and the sacrificial dielectric layer 306 is deposited by a second deposition process.

In some examples, the base dielectric layer 304 may comprise silicon oxide ($SiO_2$), phosphorus silicate glass (PSG), borophosphosilicate glass (BPSG), or a combination thereof. In some examples, the base dielectric layer 304 has a vertical thickness in the range of 0.5-1.0 µm, and the sacrificial dielectric layer 306 may comprise silicon oxide ($SiO_2$), with a vertical thickness in the range of 500-2000 Å (0.05-0.2 µm).

Figure 4A:
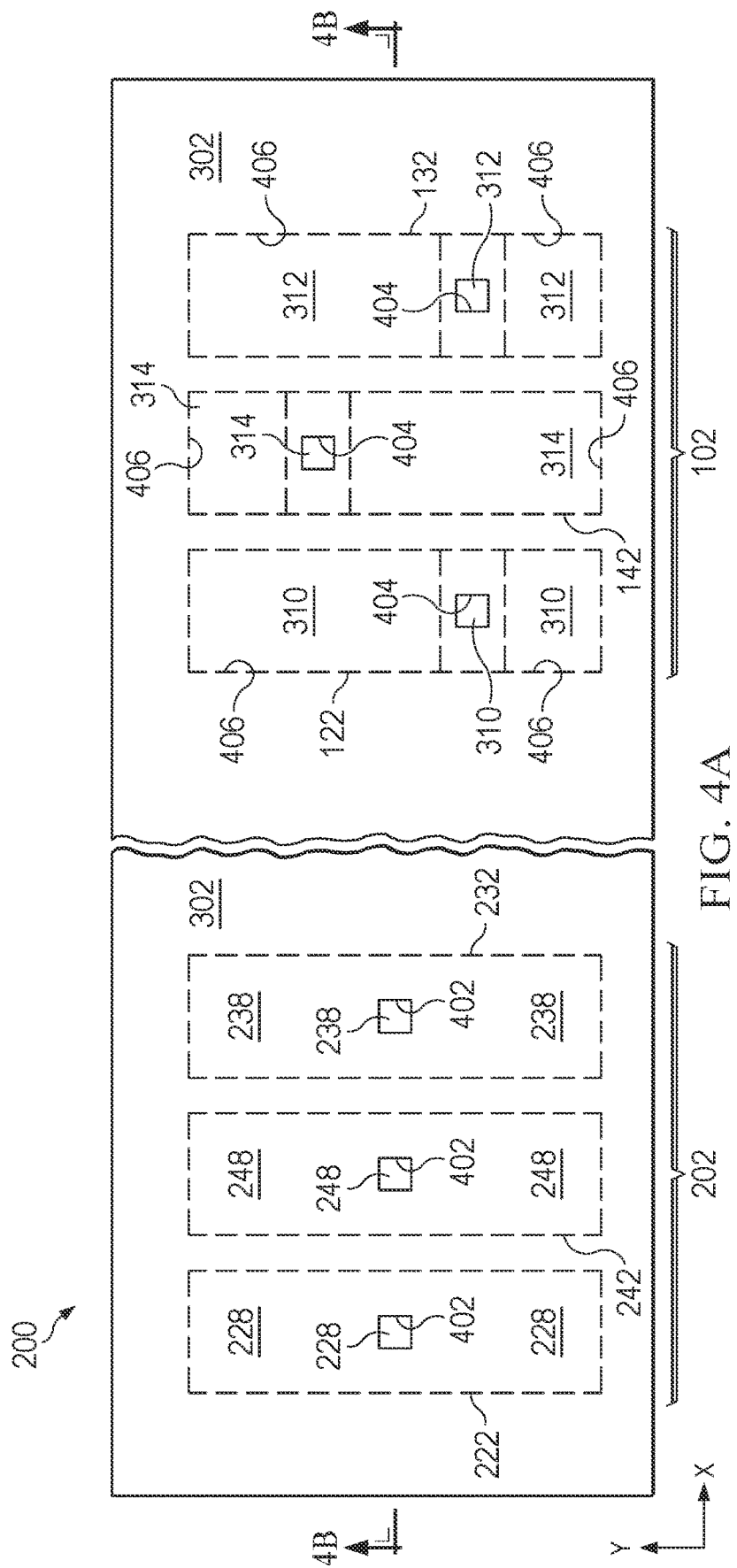
Figure 4B:
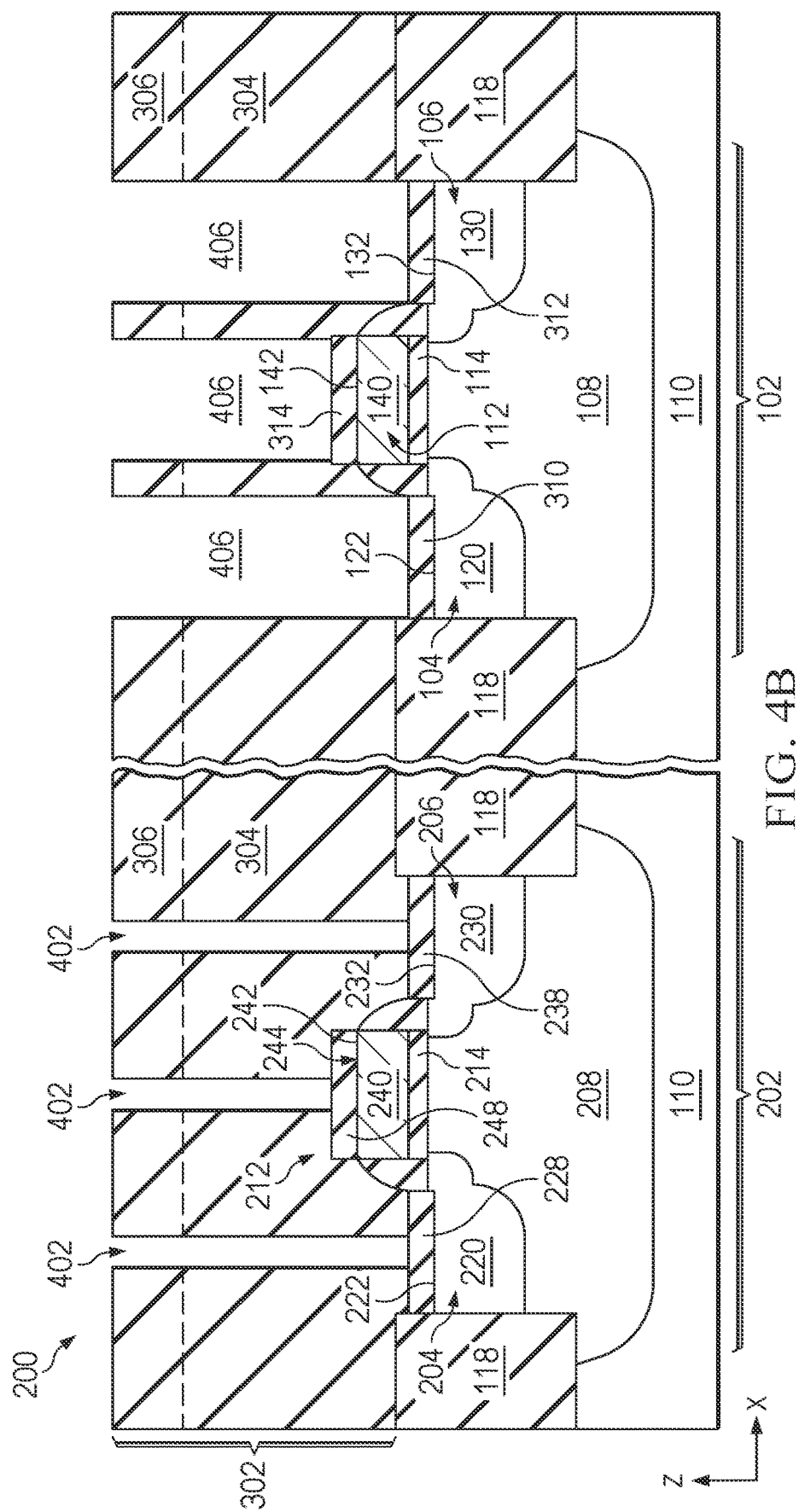

As shown in FIG. 4A (top view) and FIG. 4B (cross-sectional side view through line 4B-4B shown in FIG. 4A), a first etch process (e.g., pattern and etch process) is performed to concurrently form various openings in the dielectric region 302, including contact openings 402 formed over the fully silicided CMOS transistor 202, contact openings 404 formed over the partially silicided CMOS transistor 102, and tub openings 406 formed over the CMOS transistor 102. Contact openings 402 expose respective areas of silicide layers 228, 238, and 248 of the fully silicided CMOS transistor 202 being formed. Contact openings 404 and tub openings 406 expose respective areas of silicide layers 310, 312, and 314 of the partially silicided CMOS transistor 102 being formed. In some examples, an optional etch stop layer (not shown), e.g., a silicon nitride layer having a thickness in the range of 250-750 Å, may be deposited prior to forming dielectric region 302, e.g., for increased control of the etch process.

As shown, tub openings 406 are substantially wider (e.g., in the x-direction and y-direction) than contact openings 402 and 404. For example, respective contact openings 402 and 404 may have a lateral width (e.g., in the x-direction and y-direction) in the range of 0.1-0.5 µm, whereas respective tub openings 406 may have a lateral width (e.g., in the x-direction and y-direction) of at least 1 µm, for example in the range of 1-100 µm.

As shown in FIG. 4A, a respective contact opening 404 and at least one tub opening 406 (in the illustrated example, a pair of tub openings 406 on opposite sides of the respective contact opening 404) may be formed over the source region 104, drain region 106, and poly gate 112, respectively, to expose respective areas of the silicide layers 310, 312, and 314.

As explained below, contact openings 402 expose respective areas of silicide layers 228, 238, 248 to allow subsequent formation of respective contacts 250, 252, and 254 on the silicide layers 228, 238, 248, to provide low contact resistance to the fully silicided CMOS transistor 202. Similarly, contact openings 404 expose respective areas of silicide layers 310, 312, and 314 to allow subsequent formation of contacts 150, 152, and 154 on the silicide layers 310, 312, and 314 (or more particularly, on the silicide layer areas 128, 138, and 148 remaining after the partial silicide removal process discussed herein), to provide low contact resistance to the partially silicided CMOS transistor 102.

Figure 6A:
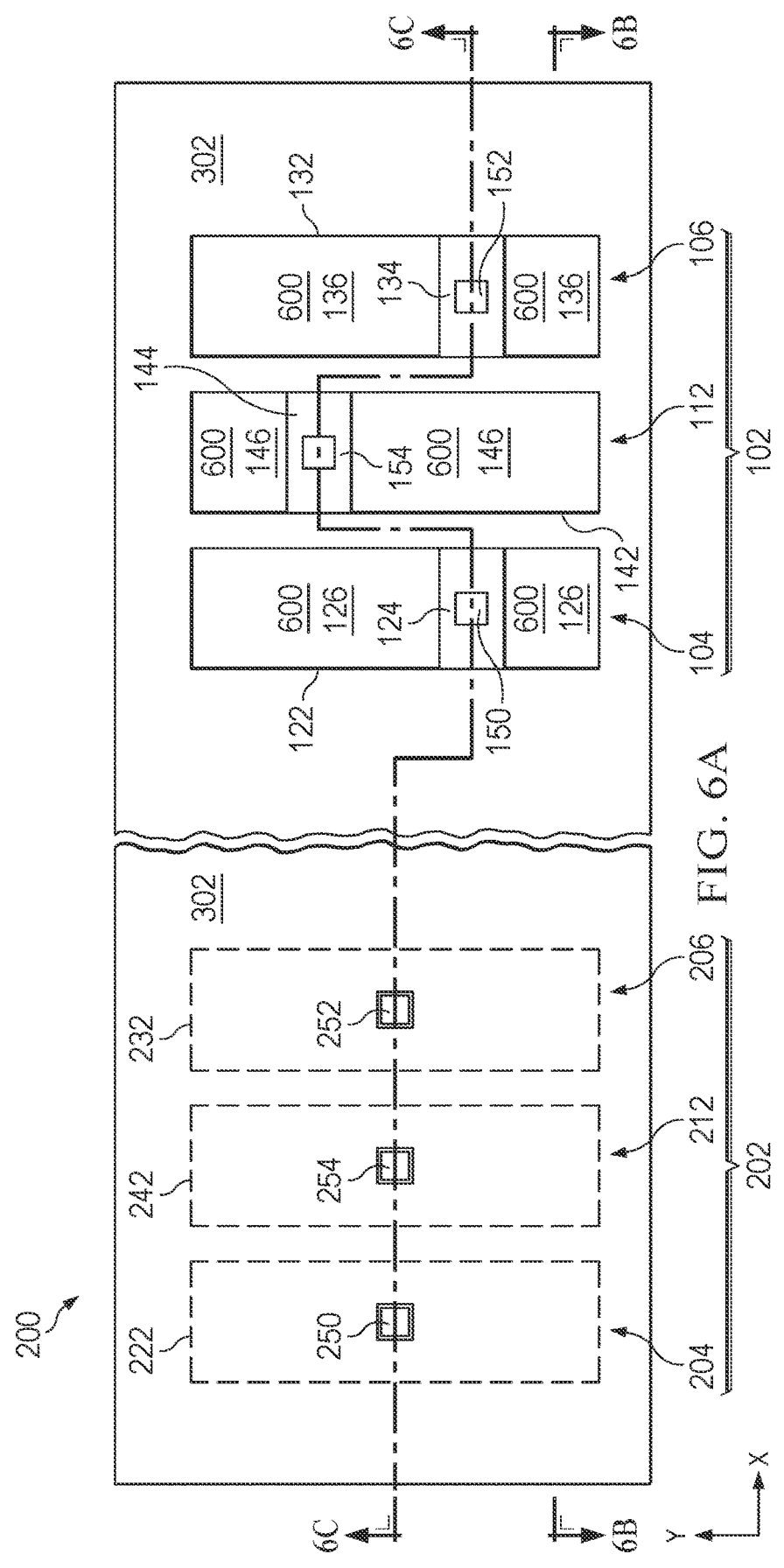
Figure 6B:
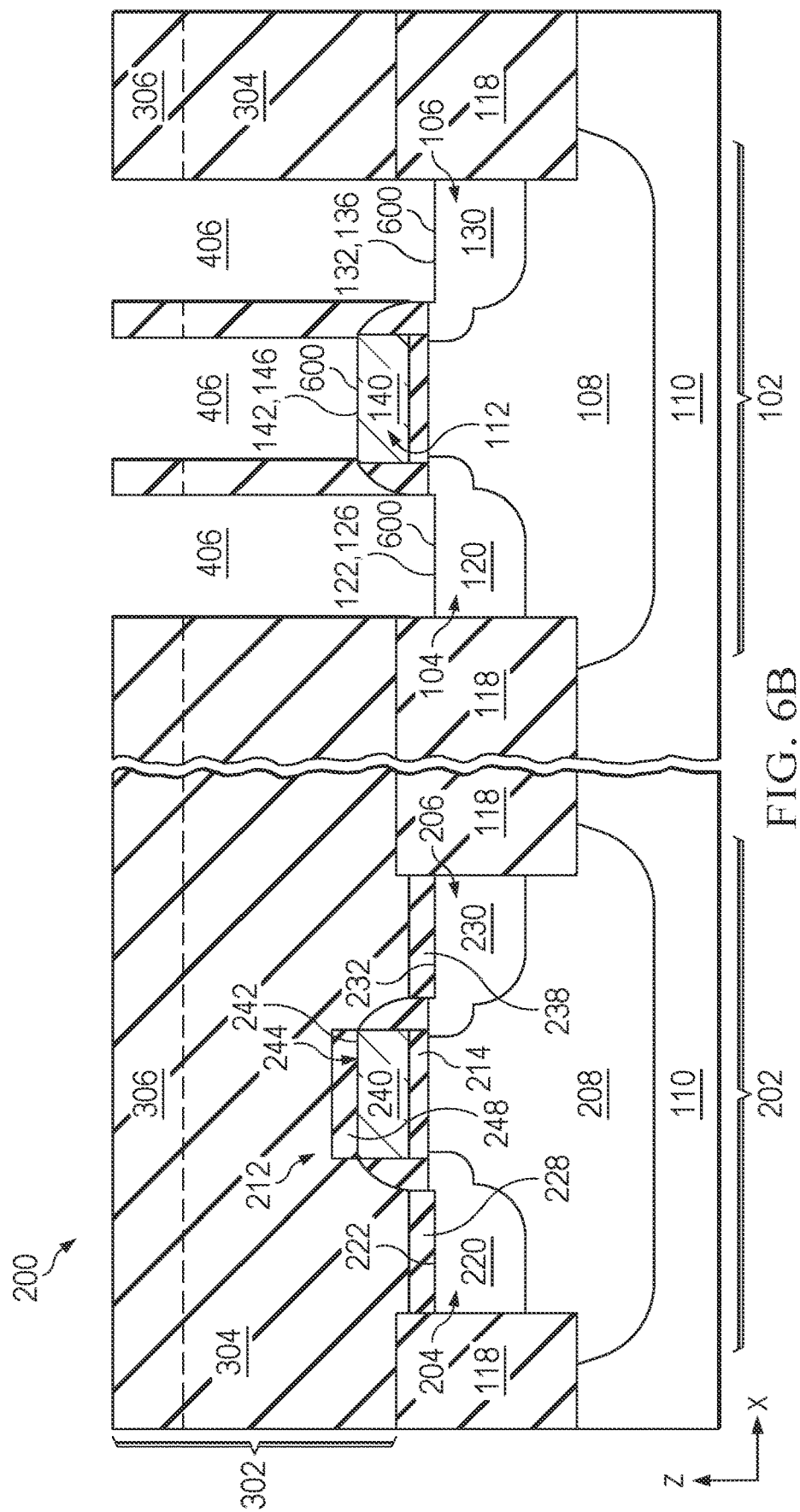

In contrast, tub openings 406 expose respective areas of silicide layers silicide layers 310, 312, and 314 to be removed by a subsequent etch process, e.g., as shown in FIGS. 6A-6B discussed below.

Figure 5A:
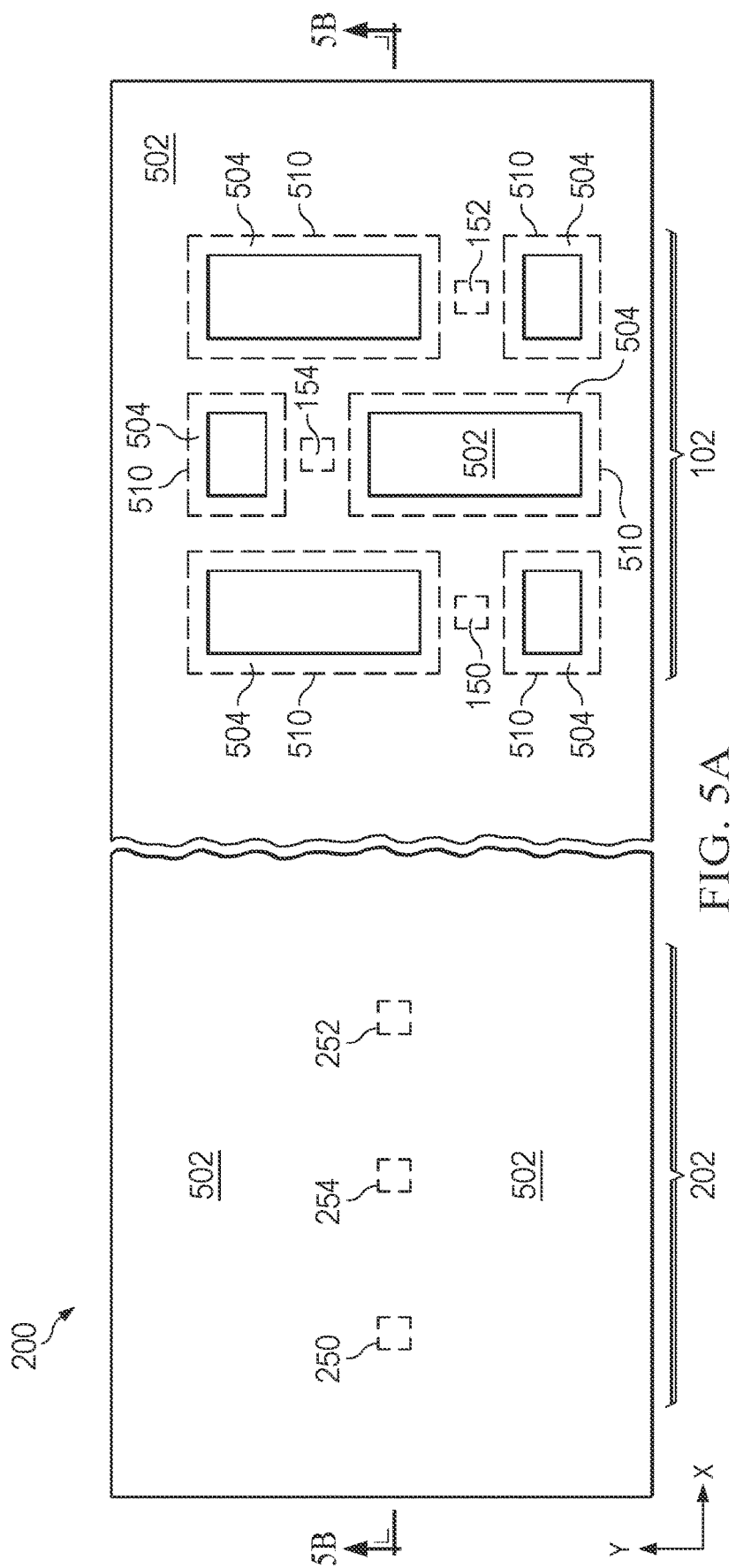
Figure 5B:
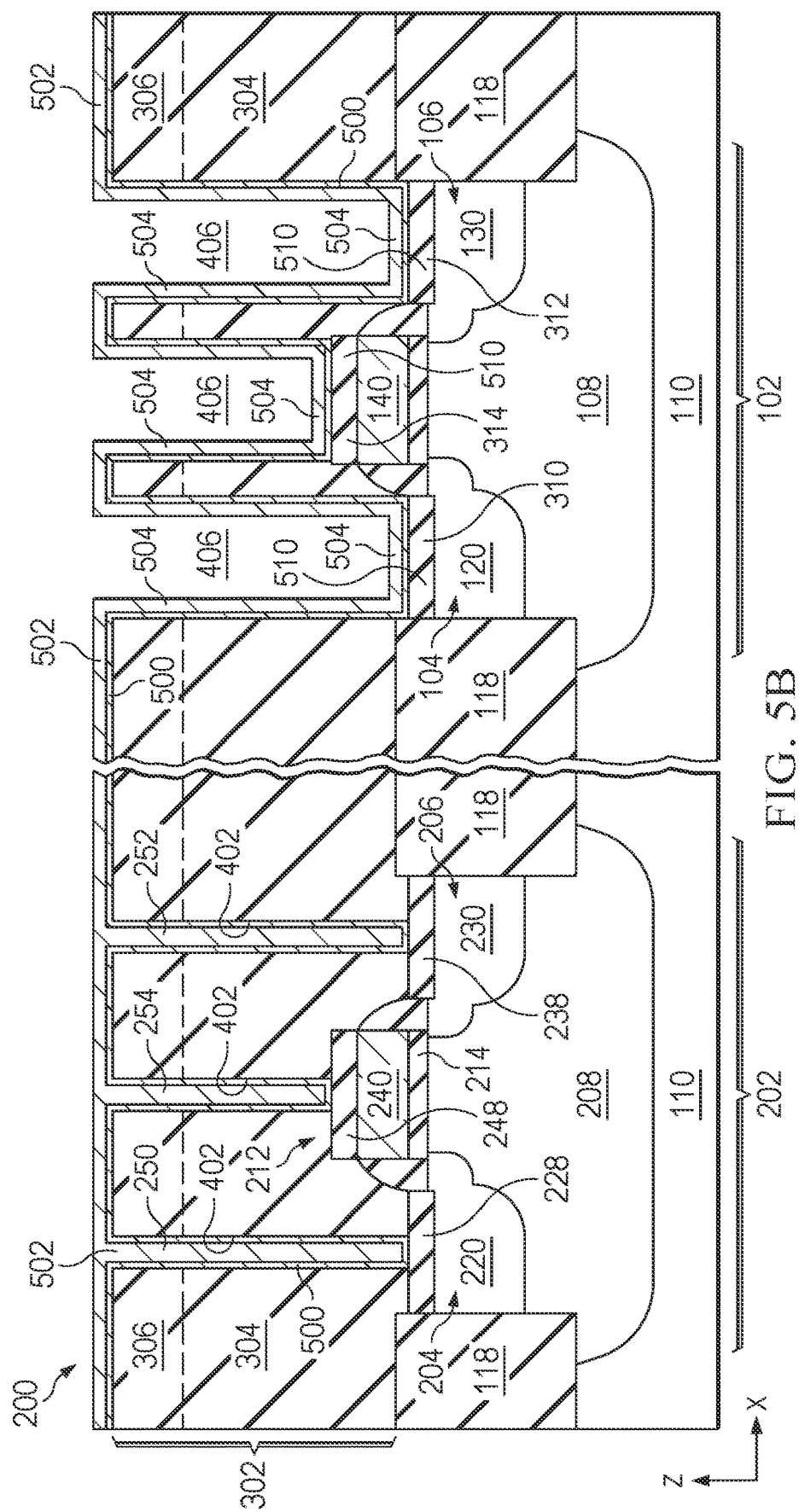

As shown in FIG. 5A (top view) and FIG. 5B (cross-sectional side view through line 5B-5B shown in FIG. 5A), a liner 500 (e.g., a titanium nitride (TiN) layer) is deposited over the dielectric region 302 and extending down into contact openings 402 and 404 and tub openings 406, followed by deposition of a conformal metal 502 over the liner 500 and extending down into contact openings 402 and 404 and tub openings 406. In some examples, the conformal metal 502 comprises tungsten or other conformal metal deposited with a thickness in the range of 1000-5000 Å, e.g., deposited using a chemical vapor deposition (CVD) process.

The deposited conformal metal 502 concurrently (a) fully fills respective contact openings 402 to form contacts 250, 252, 254 conductively connected to silicide layers 228, 238, and 248, (b) fully fills respective contact openings 404 to form contacts 150, 152, and 154 conductively connected to silicide layers 310, 312, and 314 (in particular, in the silicide layer areas 128, 138, and 148 remaining after the partial silicide removal process discussed herein, e.g., as shown in FIG. 6A discussed below), and (c) partially fills respective tub openings 406 to form cup-shaped metal structures 504 in respective tub openings 406. The cup-shaped metal structures 504 are formed over respective sacrificial areas 510 of the underlying silicide layers 310, 312, and 314 to be subsequently removed.

Figure 6C:
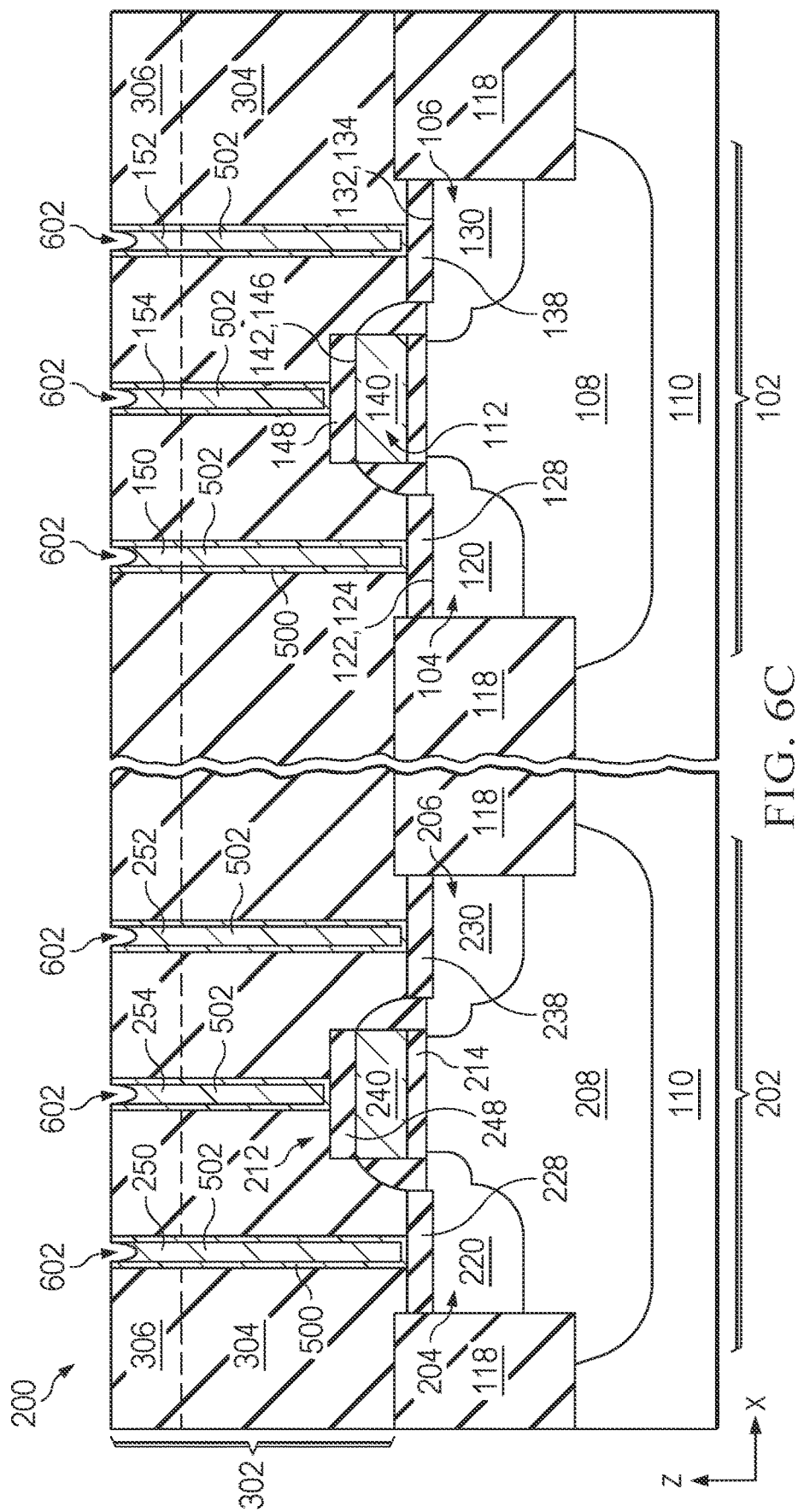

As shown in FIG. 6A (top view), FIG. 6B (cross-sectional side view through line 6B-6B shown in FIG. 6A), and FIG. 6C (cross-sectional side view through the (serpentine) line 6C-6C shown in FIG. 6A), a second etch process is performed to remove the cup-shaped metal structures 504 in the respective tub openings 406, along with the underlying sacrificial areas 510 of silicide layers 310, 312, and 314, which exposes respective areas 600 of the base structures 120, 130, and 140 under the sacrificial areas 510 of silicide layers 310, 312, and 314.

In some examples, the second etch process includes multiple etches, e.g., using different etch chemistries or process parameters. For example, the second etch process may include (a) a conformal metal etch to remove the cup-shaped metal structures 504 in the respective tub openings 406, followed by (b) a silicide etch to remove the underlying sacrificial areas 510 of silicide layers 310, 312, and 314. The conformal metal etch (e.g. tungsten etch) may comprise an isotropic wet or dry (plasma) etch, and may involve an over-etch to clear the conformal metal 502 in the respective tub openings 406. The silicide etch may comprise a wet etch process, e.g., using diluted hydrofluoric acid (DHF).

The exposed areas 600 of the base structures 120, 130, and 140 define the non-silicided regions 126, 136, and 146 of the base structure top surfaces 122, 132, and 142, respectively, of the partially silicided CMOS transistor 102 being formed, and the remaining areas of silicide layers 310, 312, and 314 (i.e., not removed by the second etch process) define the silicided regions 124, 134, and 144 of the base structure top surfaces 122, 132, and 142, respectively, of the partially silicided CMOS transistor 102 being formed.

The second etch process may stop at the original level (vertical height) of the respective base structure top surfaces 122, 132, and 142, or may extend down a small distance into the respective base structures 120, 130, and 140 (e.g., less than 100 Å) due to over-etch, resulting in the vertical height of the non-silicided regions 126, 136, and 146 being equal to, or less than, the vertical height of the corresponding silicided regions 124, 134, and 144, e.g., as discussed above regarding FIGS. 1E, 1F, and 1G.

As shown in FIG. 6C, the second etch process removes a respective upper portion 602 of respective contacts 250, 252, 254, 150, 152, and 154, e.g., by etching an upper portion of the conformal metal 502 forming the respective contacts 250, 252, 254, 150, 152, and 154. The removed upper portions 602 have a vertical depth (z-direction) extending partially through a vertical thickness of the sacrificial dielectric layer 306.

Figure 7A:
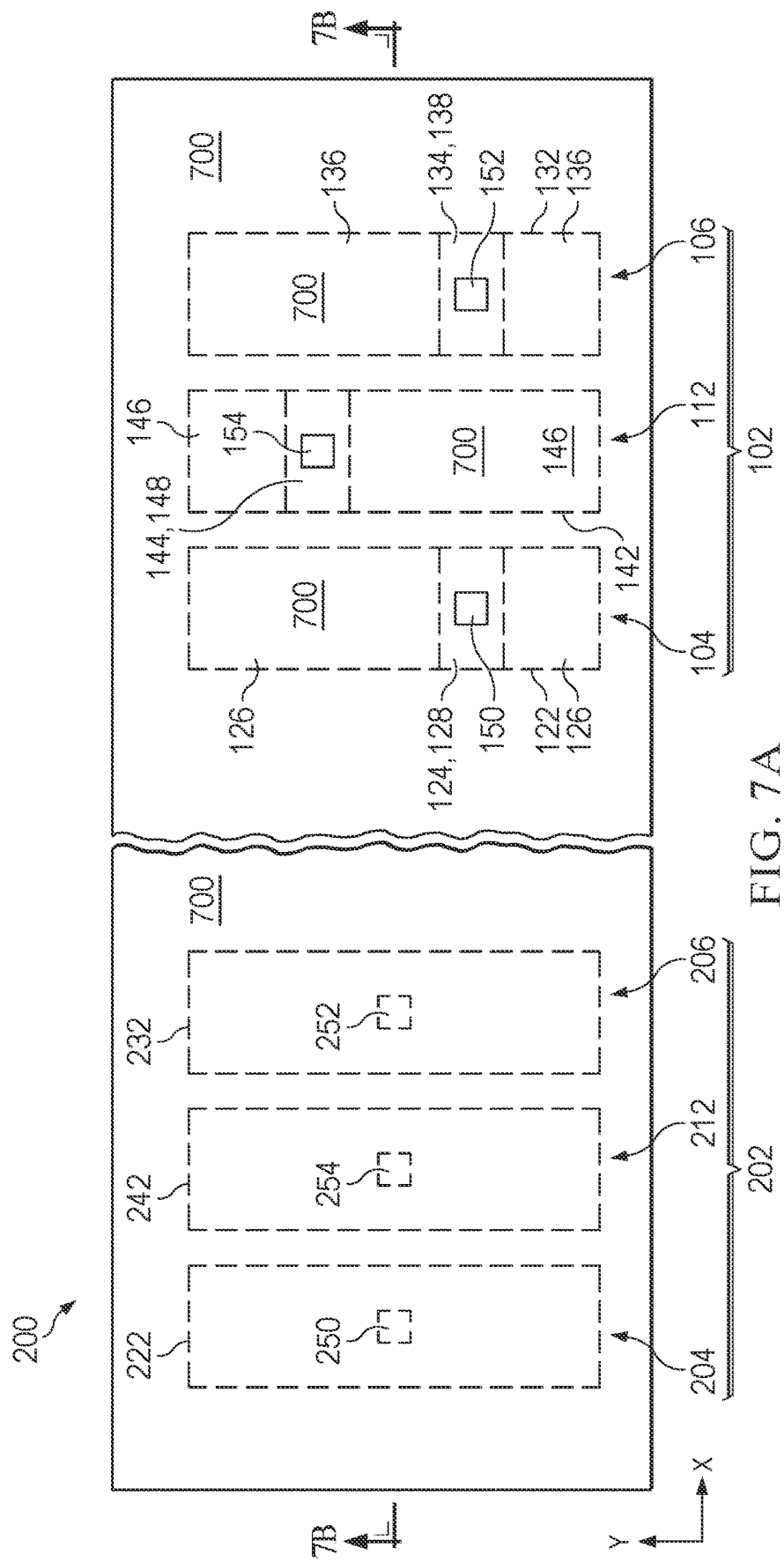
Figure 7B:
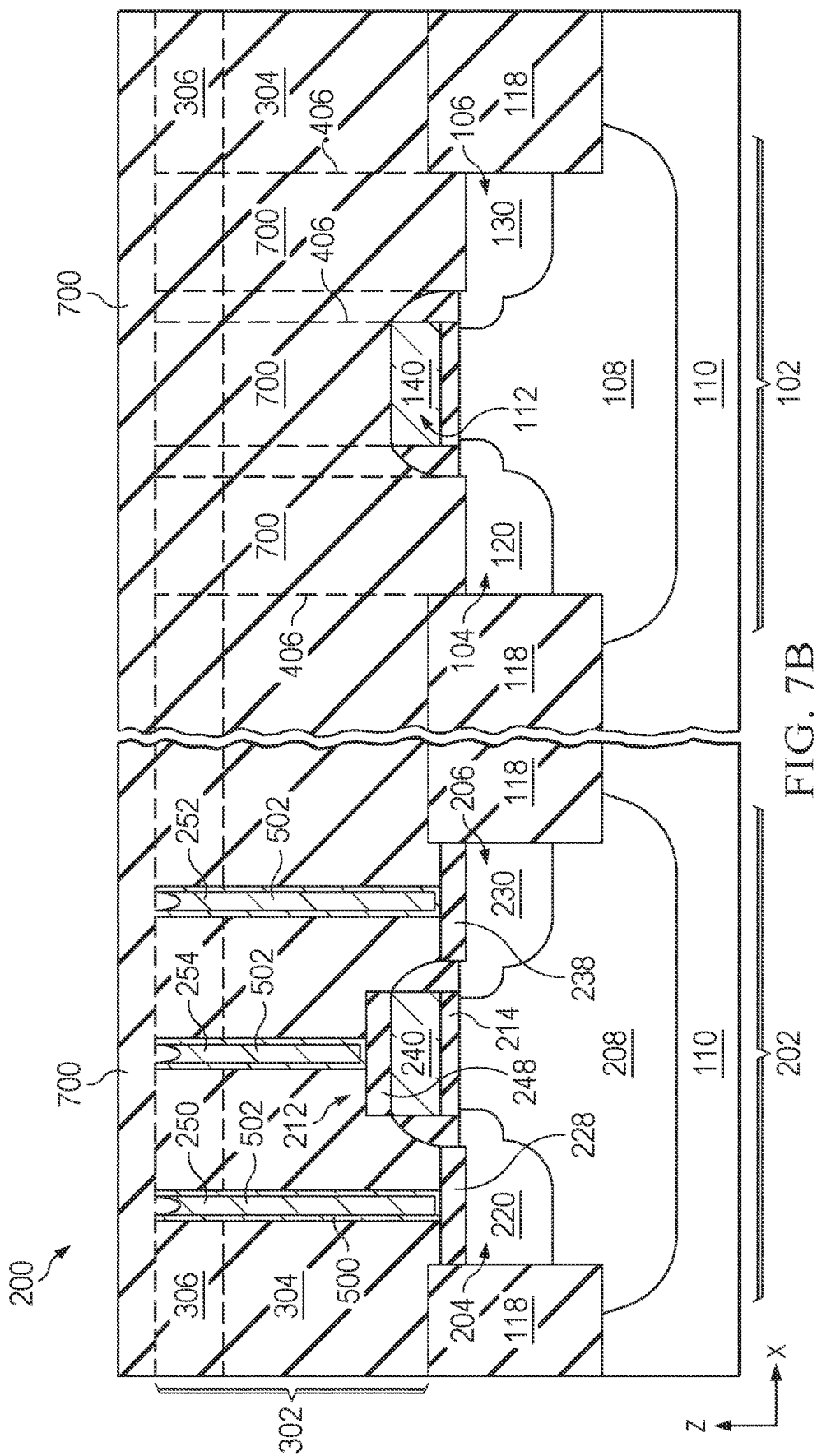

As shown in FIG. 7A (top view) and FIG. 7B (cross-sectional side view through line 7B-7B shown in FIG. 7A), a dielectric fill material 700 is deposited over the structure and extending down into the tub openings 406 to fill the tub openings 406. In some examples, the dielectric fill material 700 may comprise silicon oxide ($SiO_2$) and may be deposited by plasma-enhanced chemical vapor deposition (PECVD).

As shown in FIG. 8, which is a side cross-sectional side corresponding with the cross-section view shown in FIG. 7B, after filling the tub openings 406 with the dielectric fill material 700, a planarization process, e.g., an oxide chemical mechanical planarization (oxide CMP), is performed to remove an upper portion of the dielectric fill material 700 and a remaining portion of the sacrificial dielectric layer 306. The planarization may extend down (in the z-direction) to the top of base dielectric layer 304 or may extend a small distance (less than 500 Å) into the base dielectric layer 304. The resulting structure of the IC device 200 shown in FIG. 8 may correspond with the structure shown in FIG. 2B discussed above. After the planarization process, additional IC structures and devices may be constructed over the example partially silicided CMOS transistor 102 and fully silicided CMOS transistor 202.

As discussed above, other examples provide a resistor formed as a partially silicided element, wherein such resistor may be referred to as a partially silicided resistor.

Figure 9A:
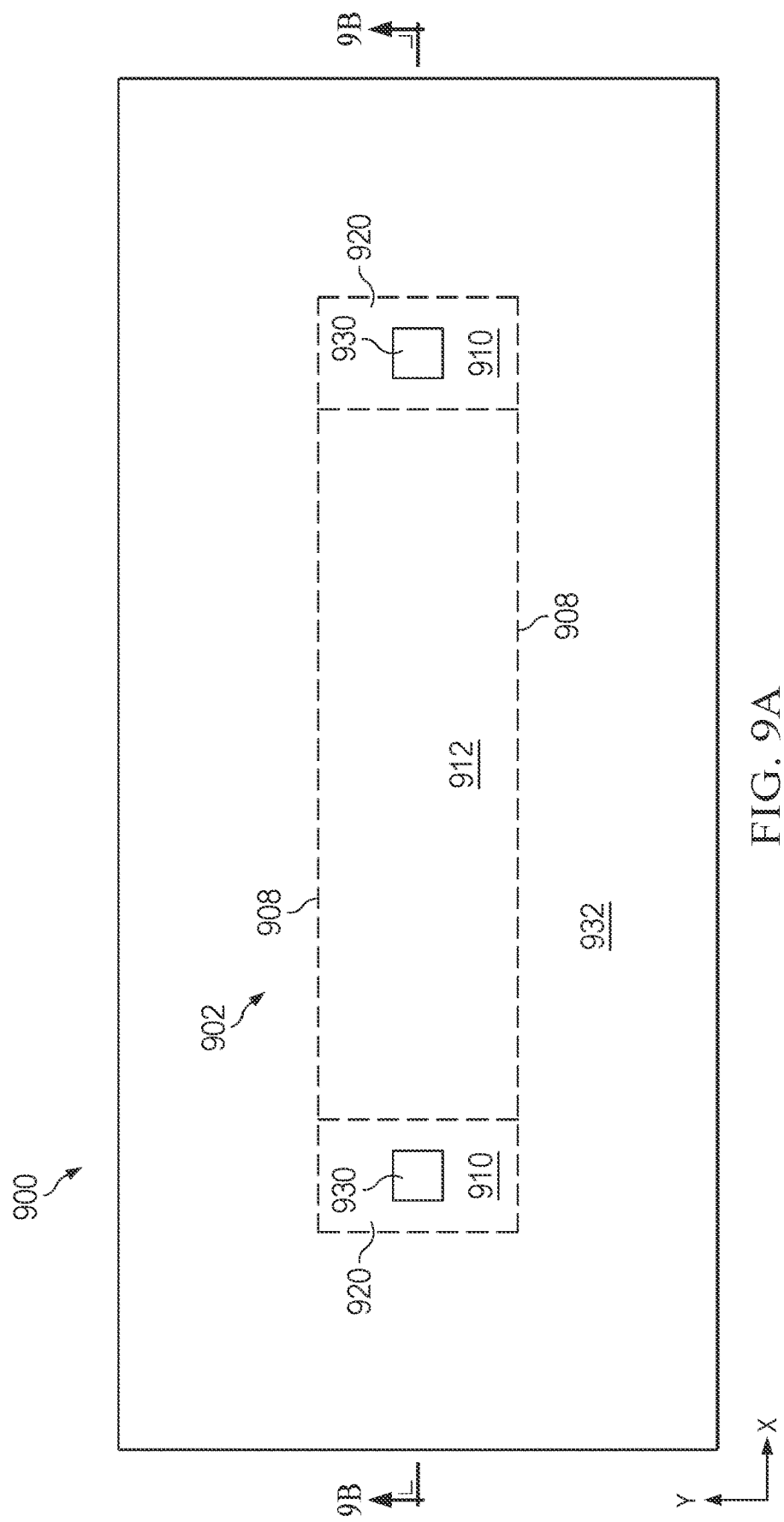
FIGS. 9A and 9B show an example partially silicided resistor, including a partially silicided resistive element.
Figure 9B:
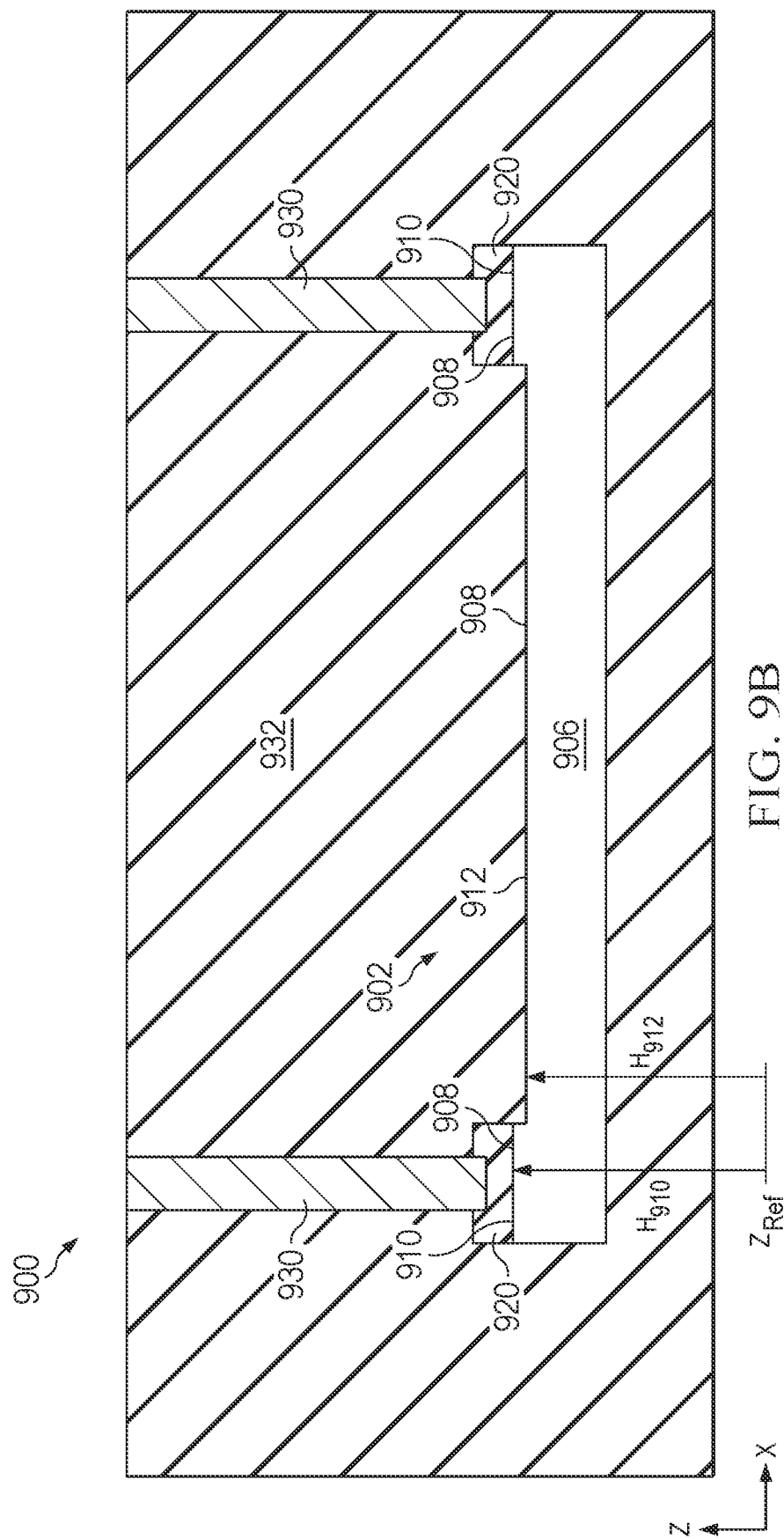

For example, FIGS. 9A and 9B show an example IC device 900 including a partially silicided resistor 902. In particular, FIG. 9A shows a top view of the example IC device 900, and FIG. 9B shows a cross-sectional side view through cut line 9B-9B shown in FIG. 9A. As shown, the partially silicided resistor 902 includes a base structure 906 (polysilicon resistive element) having a top surface 908 (polysilicon resistive element top surface 908) including a pair of silicided regions 910 and a non-silicided region 912 between the pair of silicided regions 910 (in the x-direction). The silicided regions 910 may be referred to as resistor heads, and the non-silicided region 912 may be referred to as the resistor body.

The silicided regions 910 (resistor heads) of the polysilicon resistive element top surface 908 are covered by respective silicide layer areas 920, and the non-silicided region 912 (resistor body) of the polysilicon resistive element top surface 908 is not covered by silicide. As shown in FIG. 9B, a vertical height $H_{910}$ of the silicided region 910 (in the z-direction) from an arbitrary reference plane, $Z_{ref}$, is equal to, or greater than, a vertical height $H_{912}$ of the non-silicided region 912.

As shown in FIGS. 9A and 9B, respective contacts 930 formed in a dielectric region 932 (e.g., a PMD region) over the partially silicided resistor 902 are conductively connected to the respective silicided regions 910 (resistor heads), to provide electrical contact to the polysilicon resistive element 906.

FIGS. 10A-10B through FIGS. 15A-15B illustrate an example method of forming the example IC device 900 including the partially silicided resistor 902 shown in FIGS. 9A and 9B.

Figure 10A:
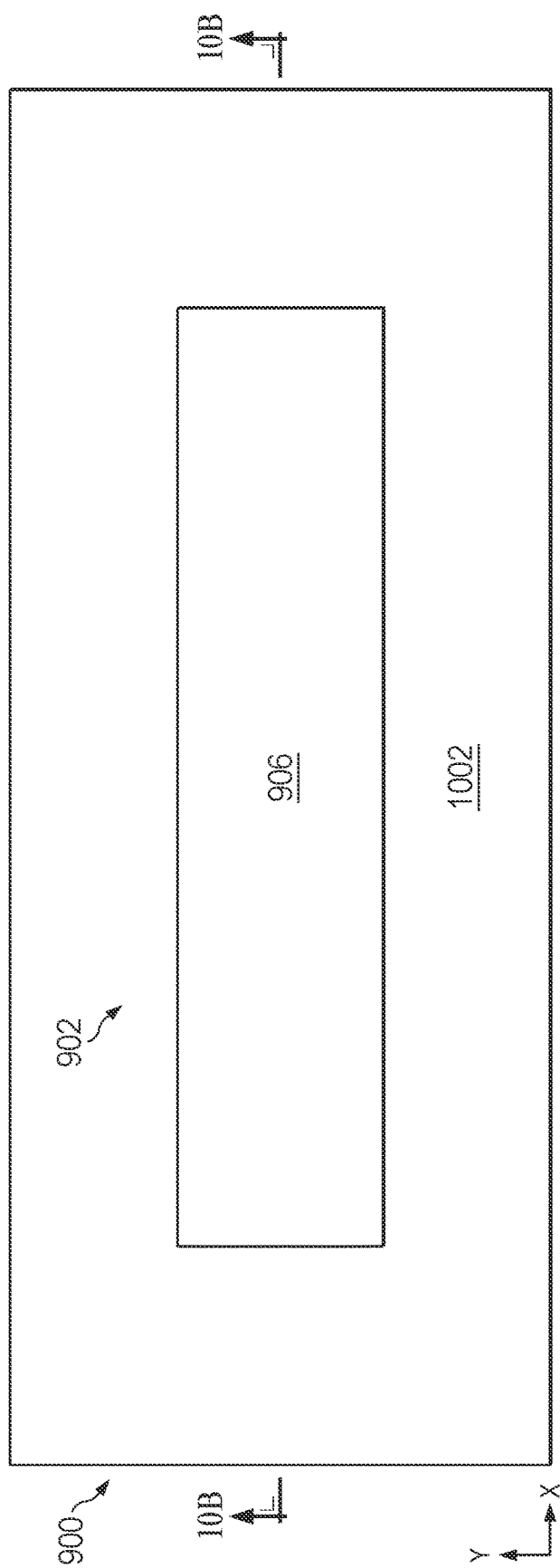
FIGS. 10A-10B through FIGS. 15A-15B illustrate an example method of forming the example partially silicided resistor shown in FIGS. 9A and 9B.
Figure 10B:
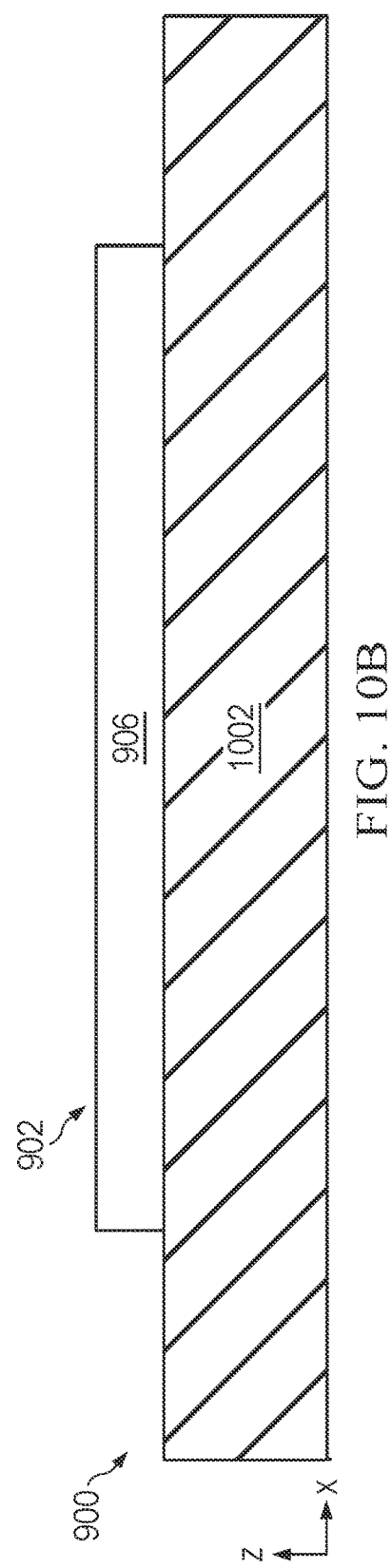

As shown in FIG. 10A (top view) and FIG. 10B (cross-sectional side view through line 10B-10B shown in FIG. 10A), the base structure 906 (polysilicon resistive element) is formed over a substrate 1002, e.g., an STI field oxide region or other dielectric region. The polysilicon resistive element 906 may be formed by depositing, patterning and etching a polysilicon layer, e.g., concurrent with formation of poly gates of respective CMOS transistors formed in the example IC device 900.

As shown in FIG. 11A (top view) and FIG. 11B (cross-sectional side view through line 11B-11B shown in FIG. 11A), a silicide layer 1100 is formed on the top surface 908 of the polysilicon resistive element 906. In some examples, the silicide layer 1100 may comprise titanium silicide (TiSi2), cobalt silicide (CoSi2), or nickel silicide (NiSi), having a thickness (z-direction) in the range of 50-300 Å.

Figure 12B:
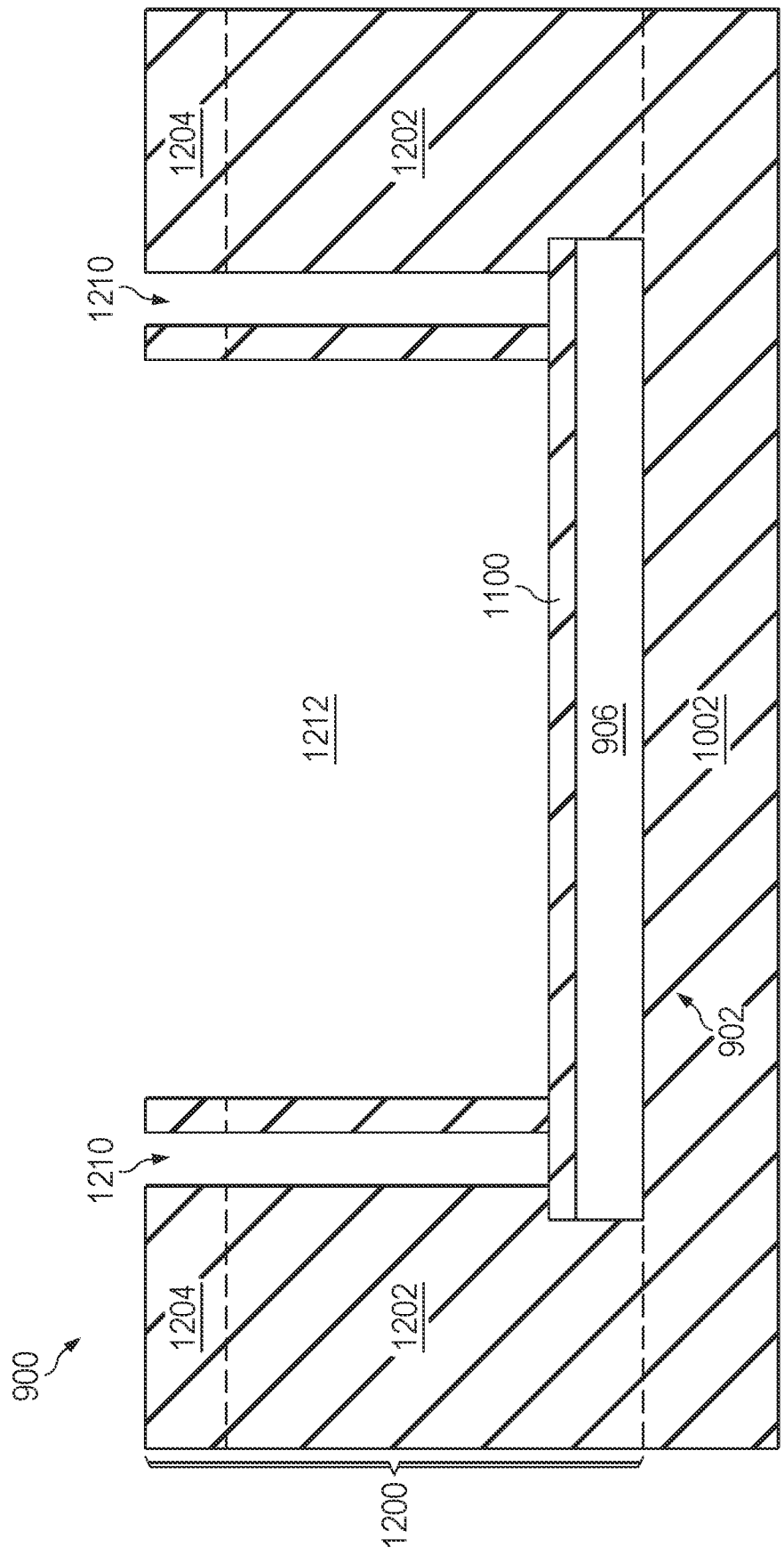

As shown in FIG. 12A (top view) and FIG. 12B (cross-sectional side view through line 12B-12B shown in FIG. 12A), a dielectric region 1200 is formed over the structure through a combination of deposition and CMP processes. The dielectric region 1200 may include a base dielectric layer 1202 and a sacrificial dielectric layer 1204 over the base dielectric layer 1202. In some examples, the base dielectric layer 1202 represents a pre-metal dielectric (PMD) region and the sacrificial dielectric layer 1204 represents a partial vertical thickness (z-direction) of the dielectric region 1200 that is removed by a subsequent planarization process, e.g., as shown in FIG. 15, discussed below. As discussed above regarding the base dielectric layer 304 and sacrificial dielectric layer 306 of the dielectric region 302, the dielectric region 1200 may comprise a continuous region of a dielectric material, wherein the dielectric base layer 1202 and sacrificial dielectric layer 1204 comprise respective partial thicknesses of the deposited dielectric material, or alternatively, the base dielectric layer 1202 and sacrificial dielectric layer 1204 may comprise different dielectric materials deposited by respective deposition processes. In some examples, the base dielectric layer 1202 may comprise $SiO_2$, PSG, BPSG, or a combination thereof. In some examples, the base dielectric layer 1202 has a vertical thickness in the range of 0.5-1.0 μm, and the sacrificial dielectric layer 1204 may comprise SiO2, with a vertical thickness in the range of 500-2000 Å (0.05-0.2 μm).

After forming the dielectric region 1200, a first etch process (e.g., pattern and etch process) is performed to concurrently form contact openings 1210 and a tub opening 1212 over the polysilicon resistive element 906. Contact openings 1210 and tub opening 1212 expose respective areas of the silicide layer 1100.

As shown, tub openings 1212 are substantially wider (e.g., in the x-direction and y-direction) than contact openings 1210. For example, respective contact openings 1210 may have a lateral width (e.g., in the x-direction and y-direction) in the range of 0.1-0.5 µm, whereas respective tub openings 1212 may have a lateral width (e.g., in the x-direction and y-direction) of at least 1 µm, for example in the range of 1-100 µm.

Figure 13A:
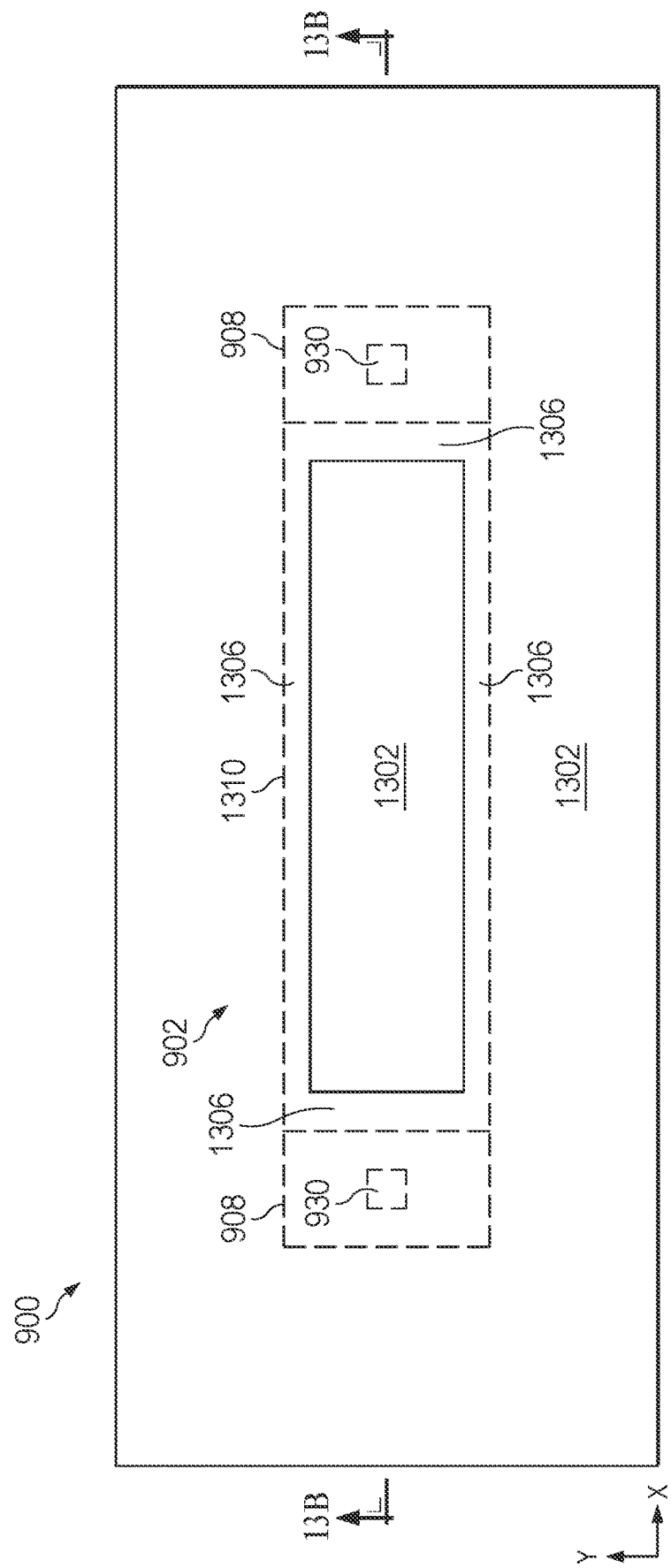
Figure 13B:
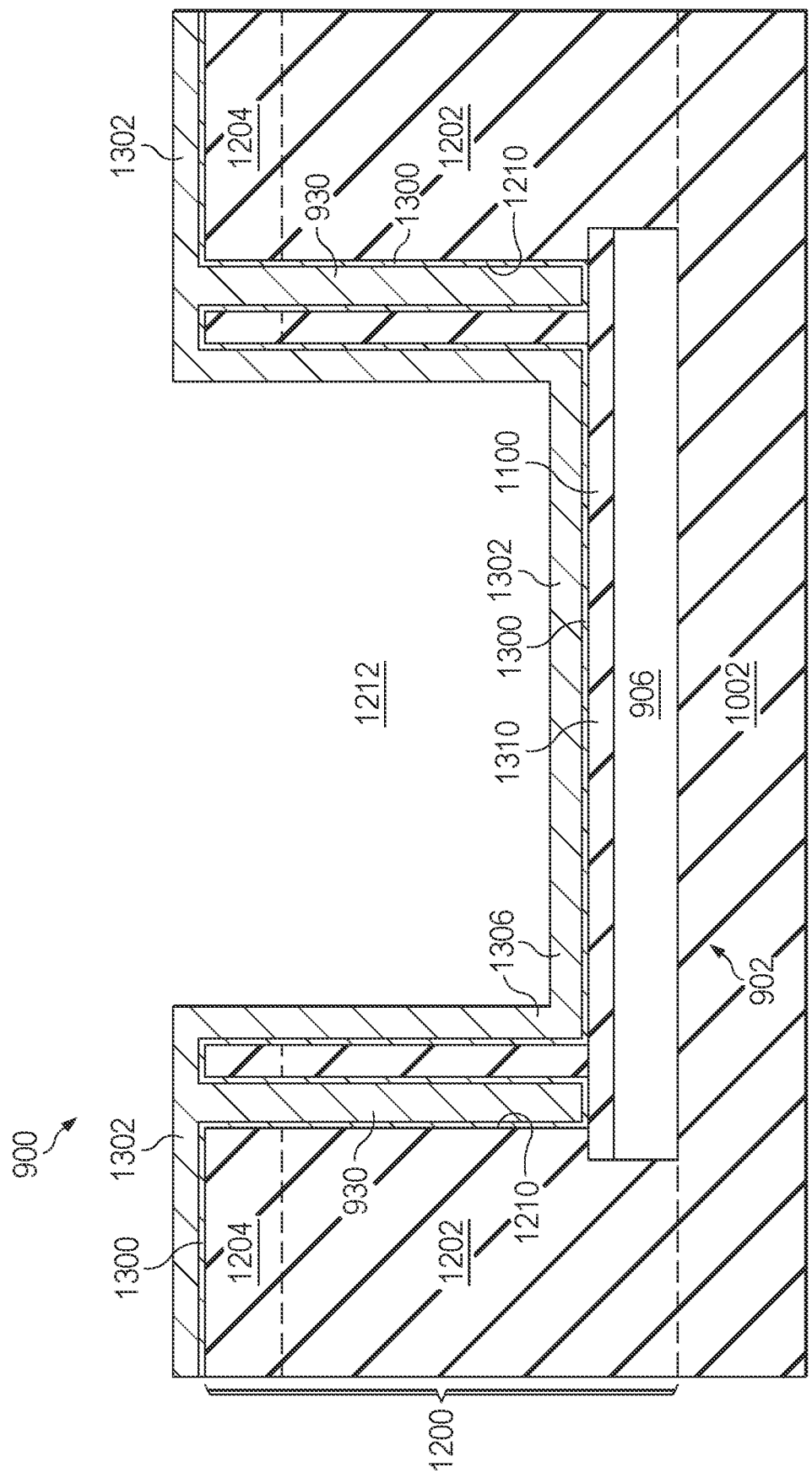

As shown in FIG. 13A (top view) and FIG. 13B (cross-sectional side view through line 13B-13B shown in FIG. 13A), a liner 1300 (e.g., a titanium nitride (TiN) layer) is deposited over the dielectric region 1200 and extending down into contact openings 1210 and tub opening 1212, followed by deposition of a conformal metal 1302 over the liner 1300 and extending down into contact openings 1210 and tub opening 1212. In some examples, the conformal metal 1302 comprises tungsten or other conformal metal deposited with a thickness in the range of 1000-5000 Å, e.g., using a chemical vapor deposition (CVD) process.

Figure 14A:
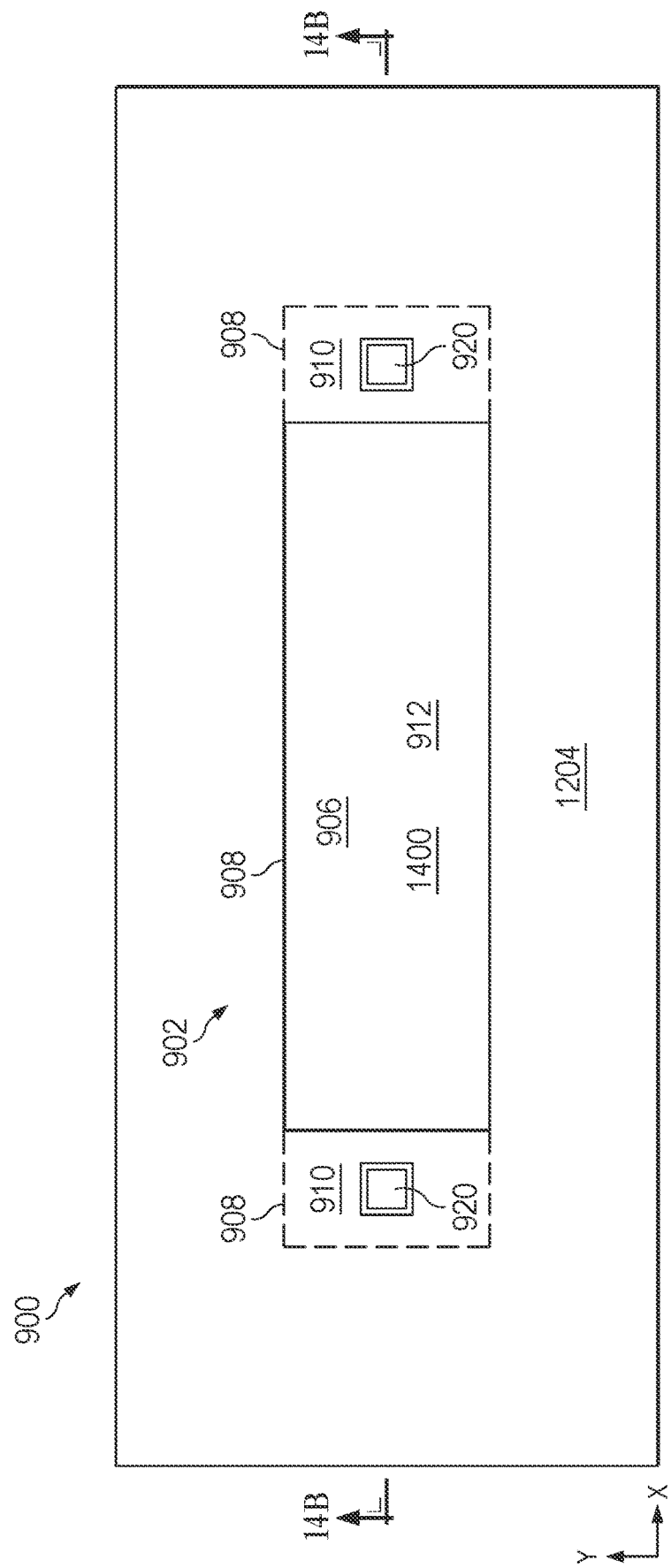
Figure 14B:
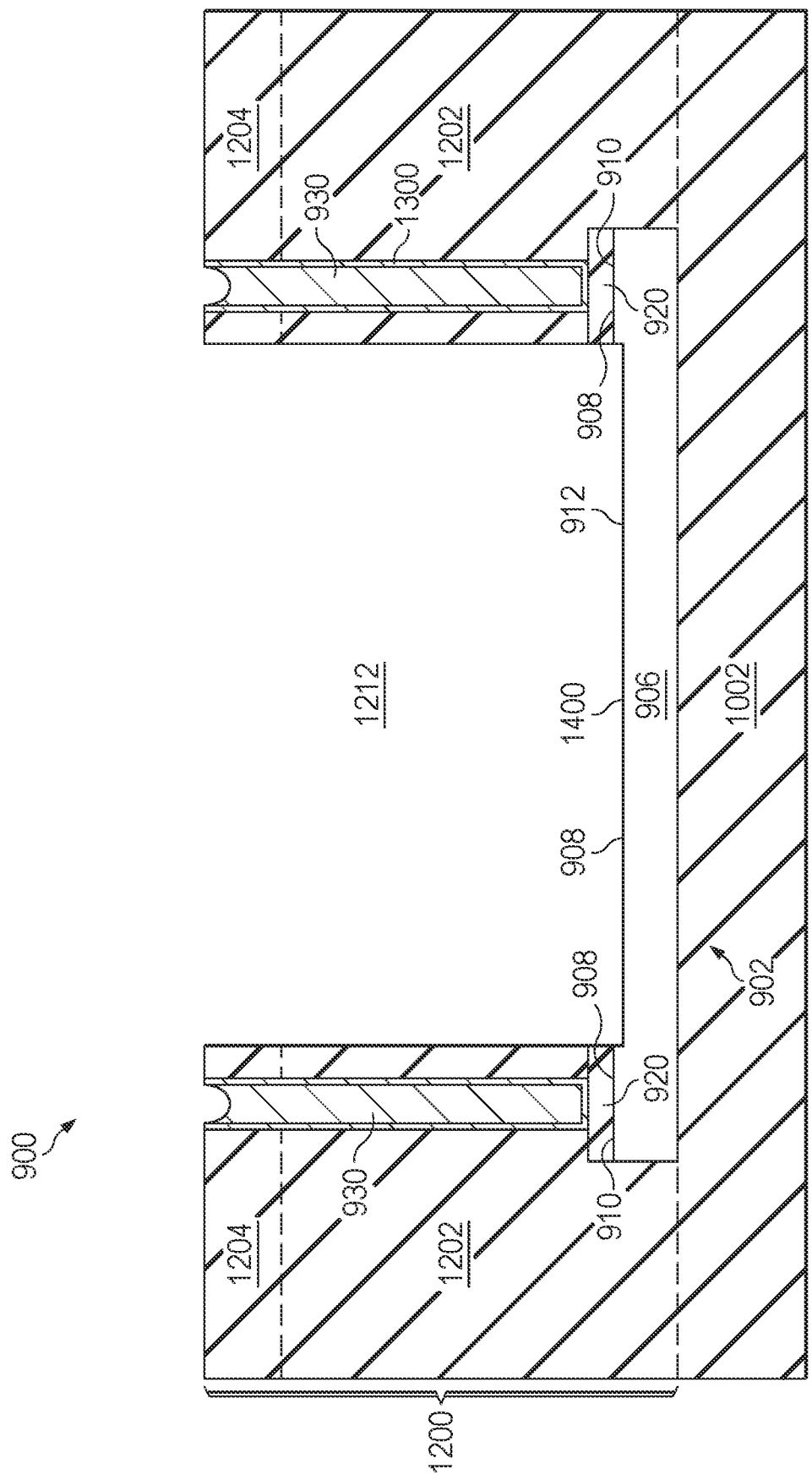

The deposited conformal metal 1302 concurrently (a) fully fills respective contact openings 1210 to form contacts 930 conductively connected to silicide layer 1100 (in particular, in the silicide layer areas 920 remaining after the partial silicide removal process discussed herein, e.g., as shown in FIGS. 14A-14B discussed below), and (b) partially fills tub opening 1212 to form a cup-shaped metal structure 1306 in the tub opening 1212. The cup-shaped metal structure 1306 is formed over a sacrificial area 1310 of the underlying silicide layer 1100 to be subsequently removed.

As shown in FIG. 14A (top view) and FIG. 14B (cross-sectional side view through line 14B-14B shown in FIG. 14A), a second etch process is performed to remove the cup-shaped metal structure 1306 in the tub opening 1212, along with the underlying sacrificial area 1310 of the silicide layer 1100, which exposes an area 1400 of the base structure (polysilicon resistive element) 906 under the sacrificial area 1310 of silicide layer 1100.

In some examples, the second etch process includes multiple etches, e.g., using different etch chemistries or process parameters. For example, the second etch process may include (a) a conformal metal etch to remove the cup-shaped metal structure 1306 in the tub opening 1212, followed by (b) a silicide etch to remove the underlying sacrificial area 1310 of silicide layer 1100. The conformal metal etch (e.g. tungsten etch) may comprise an isotropic wet or dry (plasma) etch, and may involve an over etch to clear the conformal metal 1302 from the tub opening 1212. The silicide etch may comprise a wet etch process, e.g., using diluted hydrofluoric acid (DHF).

The second etch process may stop at the original level (vertical height) of the base structure top surface 908, or may extend down a small distance into the base structure (polysilicon resistive element) 906 (e.g., less than 100 Å) due to over etch, resulting in the vertical height of the non-silicided region 912 (resistor body) being equal to, or less than, the vertical height of the silicided regions 910 (resistor heads).

In some examples, an optional implant may be applied to the exposed area 1400 of the polysilicon resistive element 906, using the sacrificial dielectric layer 1204 as a hard mask to block the implant from unwanted areas (i.e., silicided regions 910), to modify the sheet resistance value of the resulting partially silicide resistor 902.

The exposed area 1400 of the polysilicon resistive element 906 defines the non-silicided region 912 of the base structure top surface 908 of the partially silicided resistor 902, and the remaining areas of the silicide layer 1100 (i.e., not removed by the second etch process) define the silicided regions 910 of the base structure top surface 908 of the partially silicided resistor 902.

Figure 15A:
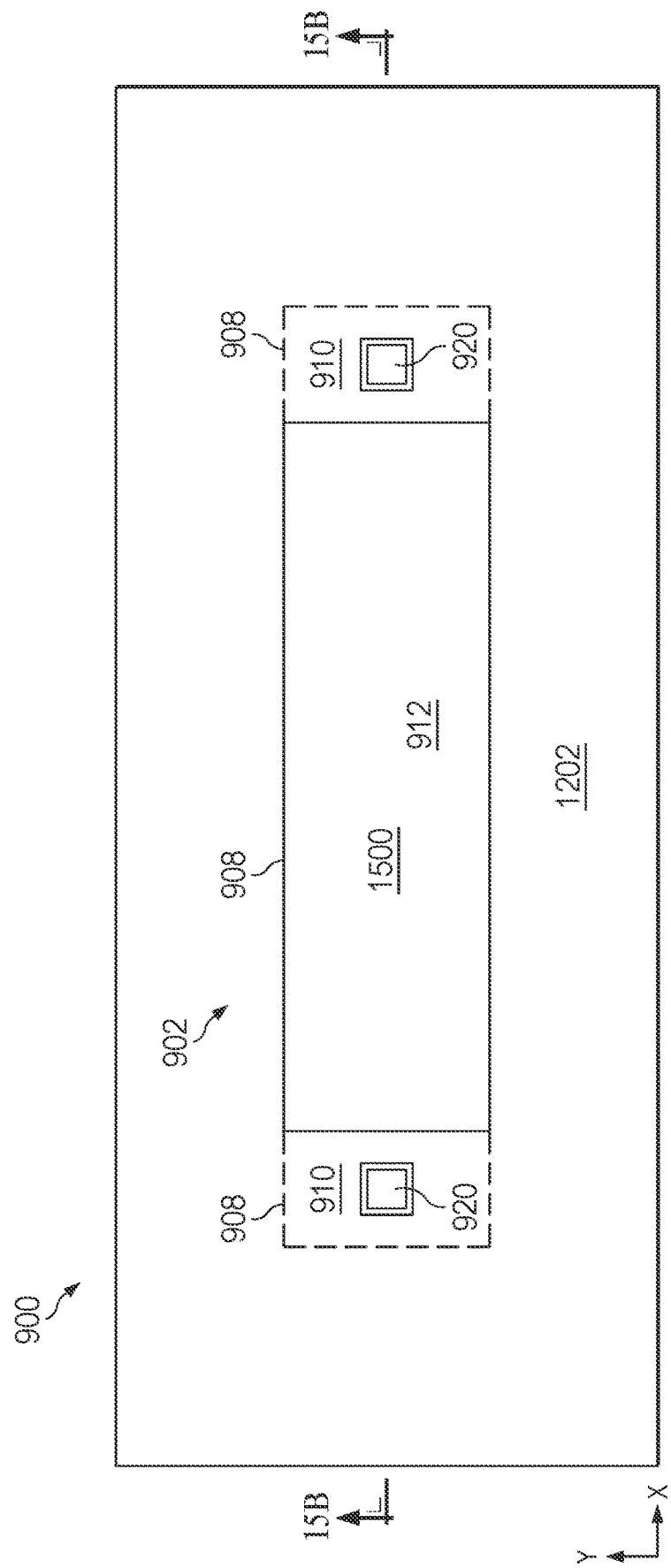
Figure 15B:
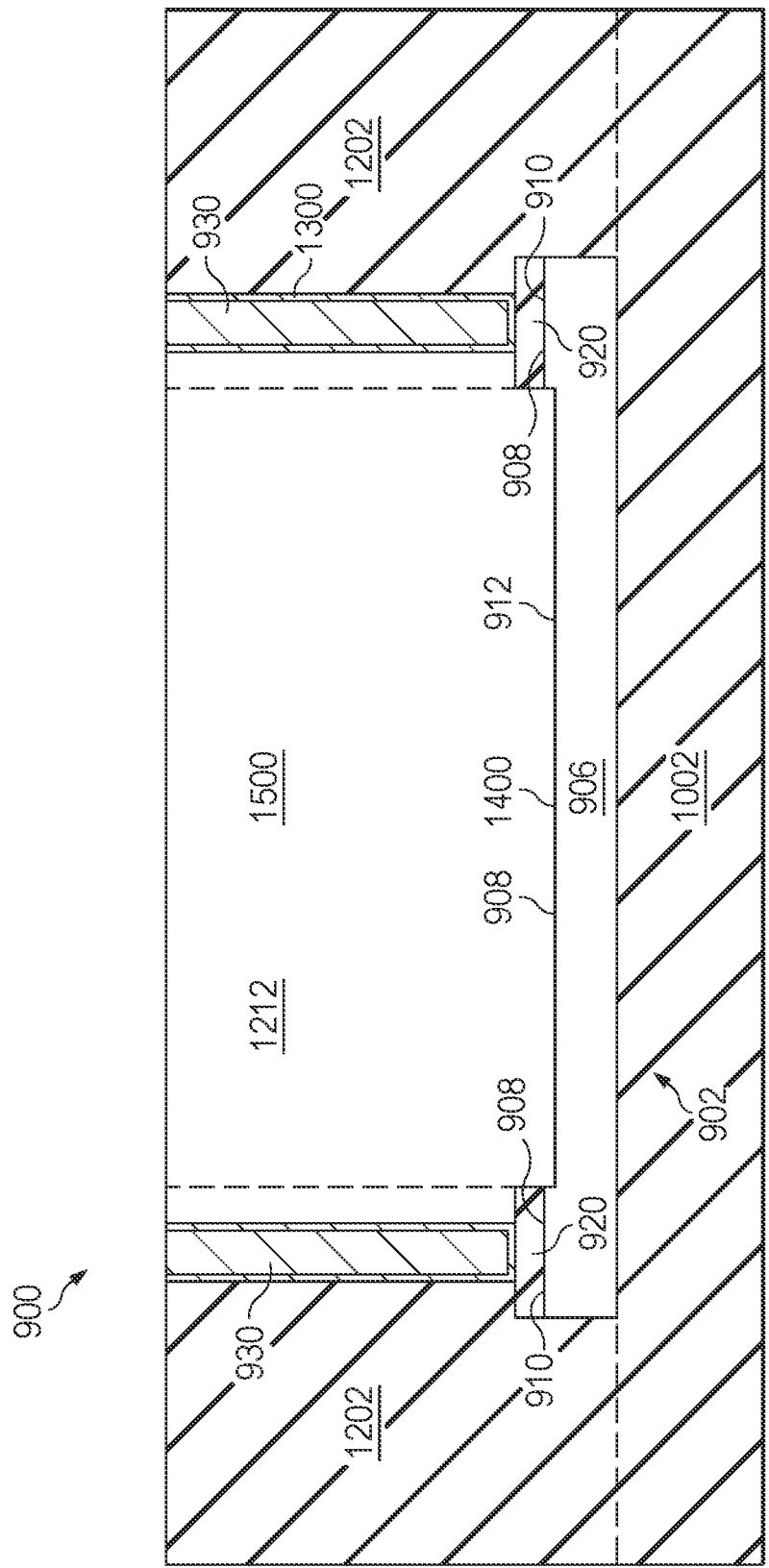

As shown in FIG. 15A (top view) and FIG. 15B (cross-sectional side view through line 15B-15B shown in FIG. 15A), a dielectric fill material 1500 is deposited over the structure and extending down into the tub opening 1212 to fill the tub opening 1212. In some examples, the dielectric fill material 1500 may comprise silicon oxide ($SiO_2$), and may be deposited by plasma-enhanced chemical vapor deposition (PECVD).

After filling the tub opening 1212 with the dielectric fill material 1500, a planarization process, e.g., an oxide CMP process, is performed to remove a remaining portion of the sacrificial dielectric layer 1204. The planarization may extend down (in the z-direction) to the top of base dielectric layer 1202 or may extend a small distance (e.g., less than 500 Å) into the base dielectric layer 1202. The resulting structure of the IC device 900 shown in FIGS. 15A-15B may correspond with the structure shown in FIGS. 9A-9B discussed above. After the planarization process, additional IC structures and devices may be constructed over the example partially silicided resistor 902.

Although example embodiments have been described above, other variations and embodiments may be made from this disclosure without departing from the spirit and scope of these embodiments.

The invention claimed is:

1. A method, comprising:
   forming a silicided structure including a silicide layer on a base structure;
   forming a dielectric region over the silicided structure;
   performing a first etch process to simultaneously form a contact opening and a tub opening in the dielectric region, the contact opening exposing a first area of the silicide layer, and the tub opening having a greater lateral width than the contact opening and exposing a second area of the silicide layer;
   depositing a conformal metal over the dielectric region, the deposited conformal metal (a) filling the contact opening to define a conformal metal contact over and conductively connected to the first area of the silicide layer and (b) partially filling the tub opening to form a cup-shaped conformal metal structure in the tub opening over the second area of the silicide layer;
   performing a second etch process to (a) remove the cup-shaped conformal metal structure from the tub opening and (b) remove the second area of the silicide layer under the cup-shaped conformal metal structure, which exposes an area of the base structure under the second area of the silicide layer, wherein the first area of the silicide layer under the conformal metal contact remains intact after the second etch process;
   wherein the base structure with the intact first area of the silicide layer and the removed second area of the silicide layer defines a partially silicided element.

2. The method of claim 1, wherein the base structure comprises a polysilicon element.

3. The method of claim 2, wherein the polysilicon element comprises a transistor gate.

4. The method of claim 2, wherein the polysilicon element comprises a resistor element.

5. The method of claim 1, wherein the base structure comprises an active region of a transistor.

6. The method of claim 1, wherein the conformal metal comprises tungsten.

7. The method of claim 1, comprising filling the tub opening with a dielectric fill material after the second etch process.

8. The method of claim 1, wherein the second etch process includes:
- a conformal metal etch to remove the cup-shaped conformal metal structure from the tub opening; and
- a silicide etch to remove the second area of the silicide layer.

9. The method of claim 1, wherein:
- the dielectric region formed over the silicided structure includes a base dielectric layer and a sacrificial dielectric layer over the base dielectric layer;
- the second etch removes an upper portion of the conformal metal contact having a vertical depth extending partially through a vertical thickness of the sacrificial dielectric layer; and
- the method includes:
  - filling the tub opening with a dielectric fill material after the second etch process; and
  - after filling the tub opening with the dielectric fill material, performing a planarization process to remove an upper portion of the dielectric fill material and a remaining portion of the sacrificial dielectric layer.

10. The method of claim 9, wherein the dielectric base layer and the sacrificial dielectric layer comprise respective portions of a dielectric material deposited over the silicided structure.

11. The method of claim 9, wherein the base dielectric layer comprises a first dielectric material and the sacrificial dielectric layer comprises a second dielectric material different than the first dielectric material.

12. The method of claim 1, wherein a lateral width of the tub opening is greater than a lateral width of the contact opening.

13. The method of claim 12, wherein:
- the contact opening has a lateral width in the range of 0.1-0.5 µm; and
- the tub opening has a lateral width in the range of 1-100 µm.

14. The method of claim 1, wherein the second base structure comprises a transistor gate, a resistor element, or an active region of a transistor.

15. The method of claim 1, wherein the second etch process includes:
- a conformal metal etch to remove the cup-shaped conformal metal structure from the tub opening; and
- a silicide etch to remove the second area of the silicide layer.

16. The method of claim 1, wherein a lateral width of the tub opening is greater than a lateral width of the first contact opening and greater than a lateral width of the second contact opening.

17. A method of forming an integrated circuit (IC) device including (a) a partially silicided element and (b) a fully silicided element, the method comprising:
- forming a first silicided structure including a first silicide layer formed on a first base structure;
- forming a second silicided structure including a second silicide layer formed on a second base structure;
- forming a dielectric region over the first and second silicided structures;
- performing a first etch process to simultaneously form a first contact opening, a second contact opening, and a tub opening in the dielectric region, wherein the first contact opening exposes the first silicide layer, the second contact opening exposes a first area of the second silicide layer, and the tub opening has a greater lateral width than the contact opening and exposes a second area of the second silicide layer;
- depositing a conformal metal over the dielectric region, the deposited conformal metal layer:
  - (a) filling the first contact opening to define a first conformal metal contact over and conductively connected to the first silicide layer;
  - (b) filling the second contact opening to define a second conformal metal contact over and conductively connected to the first area of the second silicide layer; and
  - (c) partially filling the tub opening to form a cup-shaped conformal metal structure in the tub opening over the second area of the second silicide layer;
- performing a second etch process to remove the cup-shaped conformal metal structure in the tub opening and (b) to remove the second area of the second silicide layer under the cup-shaped conformal metal structure, which exposes an area of the second base structure under the second area of the second silicide layer, wherein the first silicide layer under the first conformal metal contact and the first area of the second silicide layer under the second conformal metal contact remain intact after the second etch process; and
- filling the tub opening with a dielectric fill material;
- wherein the first base structure with the intact first silicide layer defines the fully silicided element; and
- wherein the second base structure with the intact first area of the second silicide layer and the removed second area of the second silicide layer defines the partially silicided element.

18. The method of claim 17, wherein:
- the dielectric region formed over the first and second silicided structures includes a base dielectric layer and a sacrificial dielectric layer over the base dielectric layer;
- the second etch process removes an upper portion of the first conformal metal contact and an upper portion of the second conformal metal contact respectively having a vertical depth extending partially through a vertical thickness of the sacrificial dielectric layer; and
- the method includes, after filling the tub opening with the dielectric fill material, performing a planarization process to remove remaining portions of the sacrificial dielectric layer.

19. The method of claim 18, wherein the base dielectric layer comprises a first dielectric material and the sacrificial dielectric layer comprises a second dielectric material different than the first dielectric material.

* * * * *